US006983440B1

(12) United States Patent
Nequist

(10) Patent No.: US 6,983,440 B1
(45) Date of Patent: Jan. 3, 2006

(54) SHAPE ABSTRACTION MECHANISM

(75) Inventor: Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/342,824

(22) Filed: Jan. 14, 2003

(51) Int. Cl.
*G06F 17/50* (2006.01)

(52) U.S. Cl. .................... 716/11; 716/8; 716/9; 716/10

(58) Field of Classification Search ............. 716/8–11; 707/2, 102; 703/1
See application file for complete search history.

(56) References Cited

U.S. PATENT DOCUMENTS

| | | | |
|---|---|---|---|
| 5,157,618 A | | 10/1992 | Ravindra et al. |
| 5,281,558 A | * | 1/1994 | Bamji et al. .................... 716/2 |
| 5,481,473 A | * | 1/1996 | Kim et al. ...................... 716/5 |
| 5,805,860 A | * | 9/1998 | Parham ....................... 716/12 |
| 5,911,061 A | | 6/1999 | Tochio et al. |
| 6,035,106 A | * | 3/2000 | Carruthers et al. ............ 703/1 |
| 6,230,306 B1 | | 5/2001 | Raspopovic et al. |
| 6,253,363 B1 | | 6/2001 | Gasanov et al. |
| 6,289,495 B1 | | 9/2001 | Raspopovic et al. |
| 6,324,675 B1 | | 11/2001 | Dutta et al. |
| 6,349,403 B1 | | 2/2002 | Dutta et al. |
| 6,505,327 B2 | * | 1/2003 | Lin ............................... 716/5 |
| 6,560,766 B2 | * | 5/2003 | Pierrat et al. ................. 716/19 |
| 6,625,611 B1 | * | 9/2003 | Teig et al. .................. 707/102 |
| 6,668,365 B2 | | 12/2003 | Harn |
| 6,701,306 B1 | * | 3/2004 | Kronmiller et al. ............ 707/2 |
| 6,785,874 B2 | | 8/2004 | Tsukuda |
| 6,845,495 B2 | | 1/2005 | Andreev et al. |
| 2002/0059194 A1 | | 5/2002 | Choi et al. |
| 2004/0044980 A1 | * | 3/2004 | Juengling ..................... 716/17 |

OTHER PUBLICATIONS

Brenner, U. et al. "An Effective Congestion Driven Placement Framework" *Proceedings of the 2002 International Symposium on Physical Design*, San Diego, CA (Apr. 7-11, 2002) pp. 6-11.

Hu, J. et al. "A Survey on Multi-net Global Routing for Integrated Circuits" (1998), pp. 1-68, located at http://www.ece.umn.edu/users/sachin/PUBS/integration01.pdf.

Sarker, P. et al. "Routability-Driven Repeater Block Planning Interconnect-Centric Floorplanning" *Proceedings of the International Symposium on Physical Design* (Apr. 2000) pp. 186-191.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Ahuja, R.K. et al., eds., *Network Flows. Theory, Algorithms, and Applications* (1993) pp. 510-542, Prentice Hall, Upper Saddle River, NJ.

Al-Yamani, A. et al. "HPTS: Heterogeneous Parallel Tabu Search for VLSI Placement" *Proceedings of the 2002 Congress on Evolutionary Computation* (May 12-17, 2002) 1:351-355.

(Continued)

*Primary Examiner*—Matthew Smith
*Assistant Examiner*—Naum Levin
(74) *Attorney, Agent, or Firm*—Bingham McCutchen LLP

(57) ABSTRACT

A method of simulating a design of an electronic system having multiple layers includes, for each layer, storing a plurality of shape occurrences for the layer. A hierarchy of shape instances having a plurality of levels is generated. Each shape instance corresponds to one of the shape occurrences. A hierarchy of shadow instances having a plurality of levels is generated.

48 Claims, 23 Drawing Sheets

OTHER PUBLICATIONS

Anderson, R. et al. "An O(n log n) Algorithm for 1-D Tile Compaction" *ICCAD-89—International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. 10-14, 2002) pp. 497-502.

Barzaghi, M. et al. "Hierarchical Management of VLSI Cells at Different Description Levels" *Proceedings of the 6th Mediterranean Electrotechnical Conference* (May 22-24, 1991) 1:327-330.

Benetis, R. et al. "Nearest Neighbor and Reverse Nearest Neighbor Queries for Moving Objects" *Proceedings of the International Database Engineering and Applications Symposium (IDEAS '02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996) 15(1):127-130.

Bhattacharya, S. and W.-T. TSAI "Area Efficient Binary Tree Layout" *1st Great Lakes Symposium on VLSI* (Mar. 1-2, 1991) pp. 18-24.

Blust, G. and D.P. Mehta "Corner Stitching for L-shaped Tiles" *Proceedings of the 3rd Great Lakes Symposium on VLSI, Design Automation of High Performance VLSI Systems* (Mar. 5-6, 1993) pp. 67-68.

Borah, M. et al. "An Edge-Based Heuristic for Steiner Routing" *IEEE Transactions on Computer-Aided Design of Integrated Circuits and Systems* (Dec. 1994) 13(12):1563-1568.

Brück, R. and H. Wronn "—geoADDICTION—Flexible Handling of Geometries in IC-Layout Tools" *ISCAS '88—IEEE International Symposium on Circuits and Systems* (Jun. 7-9, 1988) 1:723-726.

Cadence Design Systems, Inc. *IC Shape-Based Technology Chip Assembly User Guide* Product Version 11.0 (Nov. 2001).

Carlson, E.C. and R.A. Rutenbar "A Scanline Data Structure Processor for VLSI Geometry Checking" *IEEE Transactions on Computer-Aided Design* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) 1:603-606.

Christian, B.S. et al. "A VLSI Interval Router for High-Speed Networks" *Canadian Conference on Electrical and Computer Engineering* (May 26-29, 1996) 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks With Unrestricted Edge Costs" *IEEE Transactions on Systems, Man and Cybernetics-Part A: Systems and Humans* (Nov. 2001) 31(6):497-507.

Dijkstra, E.W. "A Note on Two Problems in Connexion with Graphs" *Numerische Mathematik* (1959) 1:269-271.

de Dood, P. et al. "A Two-Dimensional Topological Compactor With Octagonal Geometry" *28th ACM/IEEE Automation Conference* (1991) pp. 727-731.

Doong, K. Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kernighan-Lin-Type Graph-Partitioning Algorithms" *ICCAD-93—1993 IEEE/ACM International Conference on Computer-Aided Design* (Nov. 7-11, 1993) pp. 370-377.

Façanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Façanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501-V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "SHORTFINDER: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 EUROCON 2003, Computer as a Tool* (Sep. 22-24, 2003) 1:156-159.

Guibas, L.J. and J. Stolfi "On Computing All North-East Nearest Neighbors in the $L_1$ Metric" *Information Processing Letters* (Nov. 8, 1983) 17:219-223.

Hettiaratchi, S. and P.Y.K. Cheung "A novel implementation of tile-based address mapping" *DATE '04—Proceedings of the Design, Automation and Test in Europe Conference and Exhibition* (Feb. 16-20, 2004) 1:306-310.

Hsiao, P.-Y. and W.-S. Feng "Using a Multiple Storage Quad Tree on a Hierarchical VLSI Compaction Scheme" *IEEE Tranactions on Computer-Aided Design* (May 1990) 9(5):522-536.

Hsiao, P.-Y. et al. "Optimal tile partition for space region of integrated circuits geometry" *IEEE Proceedings-E* (May, 1993) 140(3):145-153.

Hur, S.-W. and J. Lillas "Relaxation and Clustering in a Local Search Framework: Application to Linear Placement" *Proceedings of the 36h Design Automation Conference* (Jun. 21-25, 1999) pp. 360-366.

Hwang, F.K. "An O(n log n) Algorithm for Rectilinear Minimal Spanning Trees" *J ACM* (Apr. 1979) 26(2):177-182.

Iwasaki, H. et al. "An Effective Data Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sep. 18-24, 2000) pp. 144-149.

Kiyota, K. and K. Fujiyoshi "Simulated Annealing Search Through General Structure Floorplans Using Sequence-Pair" *ISCAS 2000—Proceedings of the 2000 IEEE International Symposium on Circuits and Systems*, Geneva, Switzerland (May 28-31, 2000) 3:77-80.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo, Y. et al. "Self-Reforming Routing for Stochastic Search in VLSI Interconnection Layout" *Proceedings of the ASP-Dac 2000 Asia South Pacific Design Automation Conference* (Jan. 25-28, 2000) pp. 87-92.

Kuh, E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems*, Hong Kong (Jun. 9-12 1997) 2:1361-1364.

Liao, S. et al. "An Efficient External-Memory Implementation of Region Query with Application to Area Routing" *(ICCD'02)—Proceedings of the 2002 IEEE International Conference on Computer Design: VLSI in Computers and Processors* (Sep. 16-18, 2002) pp. 36-41.

Lin, Y.-L. et al. "Routing Using a Pyramid Data Structure" *ICCAD-89—1989 International Conference on Computer-Aided Design* (Nov. 5-9, 1989) pp. 436-439.

Lin, Y.-L. et al. "Hybrid Routing" *IEEE Transactions on Computer-Aided Design* (Feb. 1990) 9(2):151-157.

Linhares, A. "Synthesizing a Predatory Search Strategy for VLSI Layouts" *IEEE Transactions on Evolutionary Computation* (Jul. 1999) 3(2):147-152.

Lodha, S.K. and D. Bhatia "Bipartitioning Circuits using TABU Search" *Proceedings of the 11th Annual IEEE International ASIC Conference* (Sep. 13-16, 1998) pp. 223-227.

Luk, W.K. and A.A. Dean "Multistack Optimization for Data-Path Chip Layout" *IEEE Transactions on Computer-Aided Design* (Jan. 1991) 10(1):116-129.

Margarino, A. et al. "A Tile-Expansion Router" *IEEE Transactions on Computer-Aided Design* (Jul. 1987) 6(4):507-517.

Marple, D. et al. "Tailor: A Layout System Based on Trapezoidal Corner Stitching" *IEEE Transactions on Computer-Aided Design* (Jan. 1990) 9(1):66-90.

Mehta, D. and G. Blust "Corner Stitching for Simple Rectilinear Shapes" *IEEE Transactions on Computer-Aided Design of Integrated Circuits and Systems* (Feb. 1997) 16(2):186-198.

van der Meijs, N.P. and A.J. van Genderen "Space-Efficient Extraction Algorithms" *Proceedings of the 3rd European Conference on Design Automation* (Mar. 16-19, 1992) pp. 520-524.

van der Meijs, N.A. and A.J. van Genderen "An Efficient Algorithm for Analysis of Non-Orthogonal Layout" *ISCAS '89—IEEE International Symposium on Circuits and Systems* (May 8-11, 1989) 1:47-52.

Modarres, H. and R.J. Lomax "A Formal Approach to Design-Rule Checking" *IEEE Transactions on Computer-Aided Design* (Jul. 1987) 6(4):561-573.

Nakatake, S. et al. "Consistent Floorplanning with Hierarchical Superconstraints" *IEEE Transactions on Computer-Aided Design of Integrated Circuits and Systems* (Jan. 2002) 21(1):42-49.

Öten, R. and R. J.P. de Figueiredo "Topological Dimensionality Determination and Dimensionality Reduction Based on Minimum Spanning Trees" *ISCAS '98—Proceedings of the 1998 IEEE International Symposium on Circuits and Systems* (May 31-Jun. 3, 1998) 3:366-369.

Pitaksanonkul, A. et al. "Comparisons of Quad Trees and 4-D Trees: New Results" *IEEE Transactions on Computer-Aided Design* (Nov. 1989) 8(11):1157-1164.

Powers, K.D. et al. "The 60° Grid: Routing Channels in Width $d/\sqrt{3}$" *Proceedings of the 1st Great Lakes Symposium on VLSI* (Mar. 1-2, 1991) pp. 214-219.

Preparata, F.P. and M.I. Shamos, *Computational Geometry An Introduction* (1985) Springer-Verlag New York Inc.

Prim, R.C. "Shortest Connection Networks and Some Generalizations" *The Bell System Technical Journal* (Nov. 1957) 36(6):1389-1401.

Rothermel, H.-J. and D.A. Mlynski "Automatic Variable-Width Routing for VLSI" *IEEE Transactions on Computer-Aided Design* (Oct. 1983) 2(4):271-284.

Sait, S.M. et al. "Performance and Low Power Driven VLSI Standard Cell Placement using Tabu Search" *CED '02—Proceedings of the 2002 Congress on Evolutionary Computation* (May 12-17, 2002) 1:372-377.

Sakanushi, K. and Y. Kajitani "The Quarter-State Sequence (Q-sequence) to Represent the Floorplan and Applications to Layout Optimization" *IEEE APCCAS 2000—The 2000 IEEE Asia -Pacific Conference on Circuits and Systems* (Dec. 4-6, 2000) pp. 829-832.

Salek, A.H. et al. "Hierarchical Buffered Routing Tree Generation" *IEEE Transactions on Computer-Aided Design of Integrated Circuits and Systems* (May 2002) 21(5):554-567.

Sarrafzadeh, M. et al. "Single-Layer Global Routing" *IEEE Transactions on Computer-Aided Design of Integrated Circuits and Systems* (Jan. 1994) 13(1):38-47.

Schmiedle, F. et al. "Exact Routing with Search Space Reduction" *IEEE Transactions on Computers* (Jun. 2003) 52(6):815-825.

Séquin, C.H. and H. da Silva Façanha "Corner-Stitched Tiles with Curved Boundaries" *IEEE Transactions on Computer-Aided Design of Integrated Circuits and Systems* (Jan. 2003) 12(1):47-58.

Serdar, T. and C. Sechen "Automatic Datapath Tile Placement and Routing" *Conference and Exhibition on Design, Automation and Test in Europe* (Mar. 13-16, 2001) pp. 552-559.

Sim, S.-P. et al. "Analytical Capacitance Model for High-Speed Interconnects with Diagonal Routing" *Proceedings of the IEEE 2002 International Interconnect Technology Conference* (Jun. 3-5, 2002) pp. 157-158.

Su, S.J. and Y.S. Kuo "Multicell Quad Trees" *Proceedings of the 3rd European Conference on Design Automation* (Mar. 16-19, 1992) pp. 147-151.

Sun, P.K. "An Octagonal Geometry Compactor" *Proceedings of the 1998 IEEE International Conference on Computer Design: VLSI in Computers and Processors—ICCD '88* (Oct. 3-5, 1988) pp. 190-193.

Suzuki, G. et al. "MOSAIC: A Tile-Based Datapath Layout Generator" *ICCAD-92—1992 IEEE/ACM International Conference on Computer Aided Design* (Nov. 8-12, 1992) pp. 166-170.

Tan, X. and X. Song "Improvement on the diagonal routing model" *IEEE Proceedings on Circuits, Devices and Systems* (Dec. 1994) 141(6):535-536.

Tarjan, R.E., ed. *Data Structures and Network Algorithms* Society for Industrial and Applied Mathematics, Philadelphia, PA (1983) pp. 71-83.

Tsai, C.-C. et al. "An H-V Alternating Router" *IEEE Transactions on Computer-Aided Design* (Aug. 1992) 11(8):976-991.

Tseng, H.-P. and C. Sechen "A Gridless Multi-Layer Router for Standard Cell Circuits using CTM Cells" *ED&TC 97—Proceedings of the European Design and Test Conference* (Mar. 17-20, 1997) pp. 319-326.

Tseng, H.-P. and C. Sechen "A Gridless Multilayer Router for Standard Cell Circuits Using CTM Cells" *IEEE Transactions on Computer-Aided Design of Integrated Circuits and Systems* (Oct. 1999) 18(10):1462-1479.

Tzionas, P.G. et al. "A New, Cellular Automaton-Based, Nearest Neighbor Pattern Classifier and Its VLSI Implementation" *IEEE Transactions on Very Large Scale Integration (VLSI) Systems* (Sep. 1994) 2(3):343-353.

Wu, G.-M. et al. "Rectilinear Block Placement Using B*-Trees" *Proceedings of the International Conference on Computer Design* (Sep. 17, 2000) pp. 351-356.

Xing, Z. and R. Kao "Shortest Path Search Using Tiles and Piecewise Linear Cost Propagation" *IEEE Transactions on Computer-Aided Design of Integrated Circuits and Systems* (Feb. 2002) 21(2):145-158.

Xu, N. et al. "TSCSP: Tabu Search Algorithm for VLSI Module Placement Based on the Clustering Sequence-Pair" *5th International Conferenece on ASIC* (Oct. 21-24, 2003) 1:306-310.

Yamazaki, H. et al. "Optimum Packing of Convex-Polygons by a New Data Structure Sequence-Table" *IEEE APCCAS 2000—The 2000 IEEE Asia-Pacific Conference on Circuits and Systems* (Dec. 4-6, 2000) pp. 821-824.

Yan, Z. et al. "Area Routing Oriented Hierarchical Corner Stitching with Partial Bin" *Proceedings of the ASP-DAC 2000 Asia-South Pacific Design Automation Conference* (Jan. 25-28, 2000) pp. 105-110.

Yu, Z. et al. "Layout-based 3D Solid Modeling for IC" *Proceedings of the 1995 International Symposium on VLSI Technology, Systems and Applications* (May 31-Jun. 2, 1995) pp. 108-112.

Zhang, Y. et al. "A Gridless Router Based on Hierarchical PB Corner Stitching Structure" *IEEE 2002 International Conference on Communications, Circuits and Systems and West Sino Expositions* (Jun. 29-Jul. 1, 2002) 2:1438-1443.

Zheng, S.-Q. et al. "Efficient Maze-Running and Line-Search Algorithms for VLSI Layout" *Proceedings for the IEEE Southeastcon '93* (Apr. 4-7, 1993) 7 p.

Zheng, S.Q. et al. "Finding Obstacle-Avoiding Shortest Paths Using Implicit Connection Graphs" *IEEE Transactions on Computer-Aided Design of Integrated Circuits and Systems* (Jan. 1996) 15(1):103-110.

Zheng, S.Q. et al. "Routing Using Implicit Connection Graphs" *9th International Conference on VLSI Design* (Jan. 3-6, 1996) pp. 49-52.

* cited by examiner

Layer 1 Shapes

Layer 2 Shapes

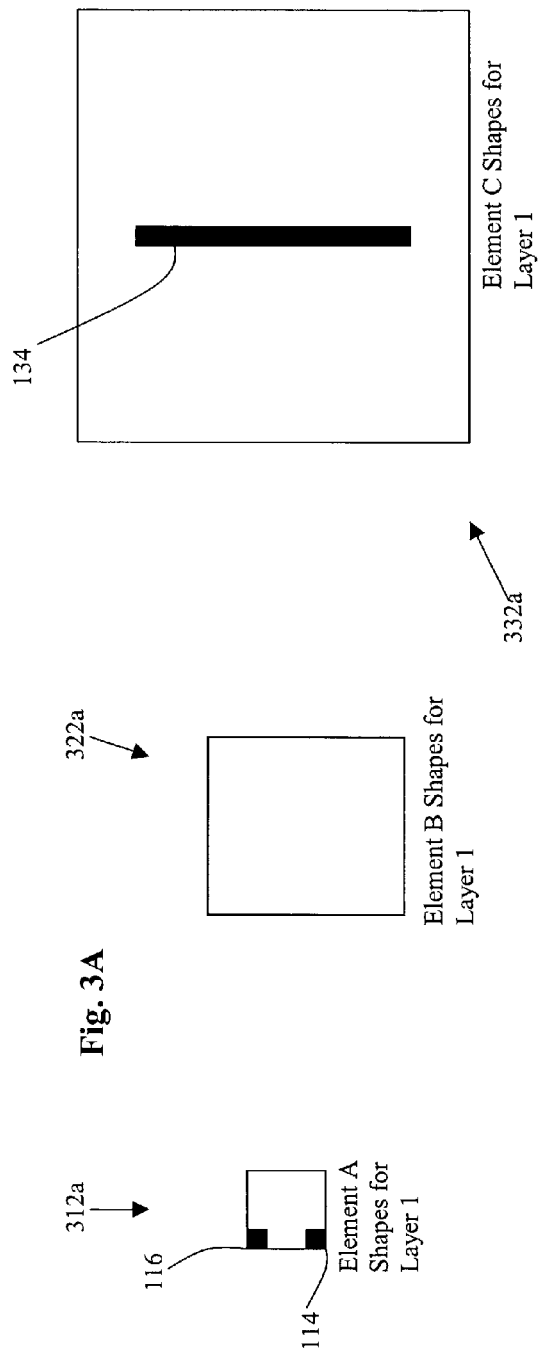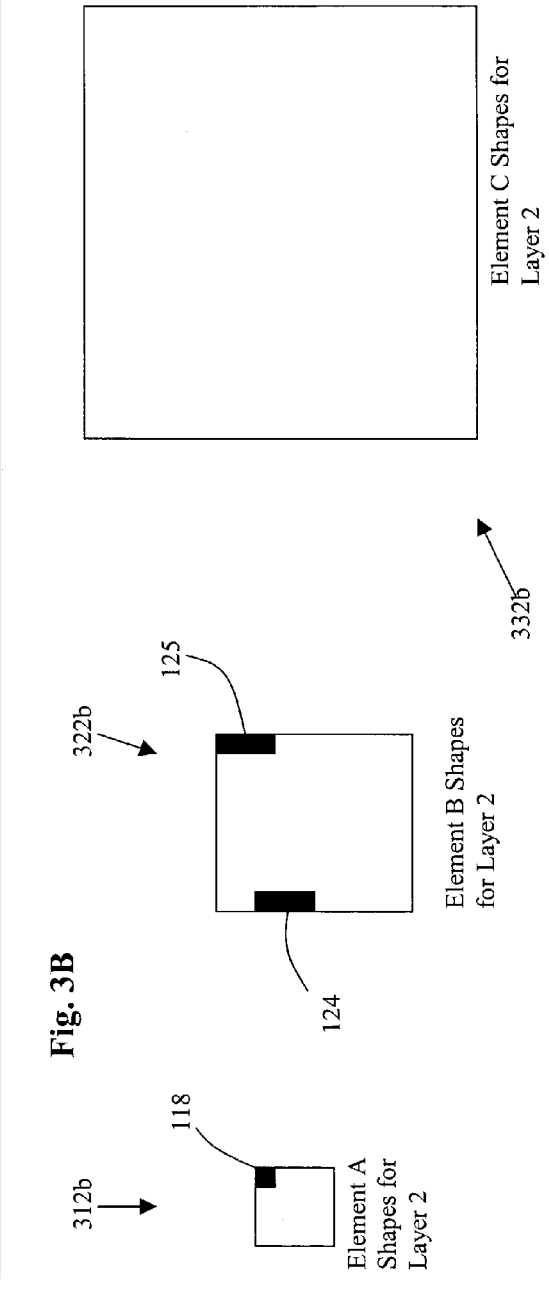
Fig. 3A
Fig. 3B

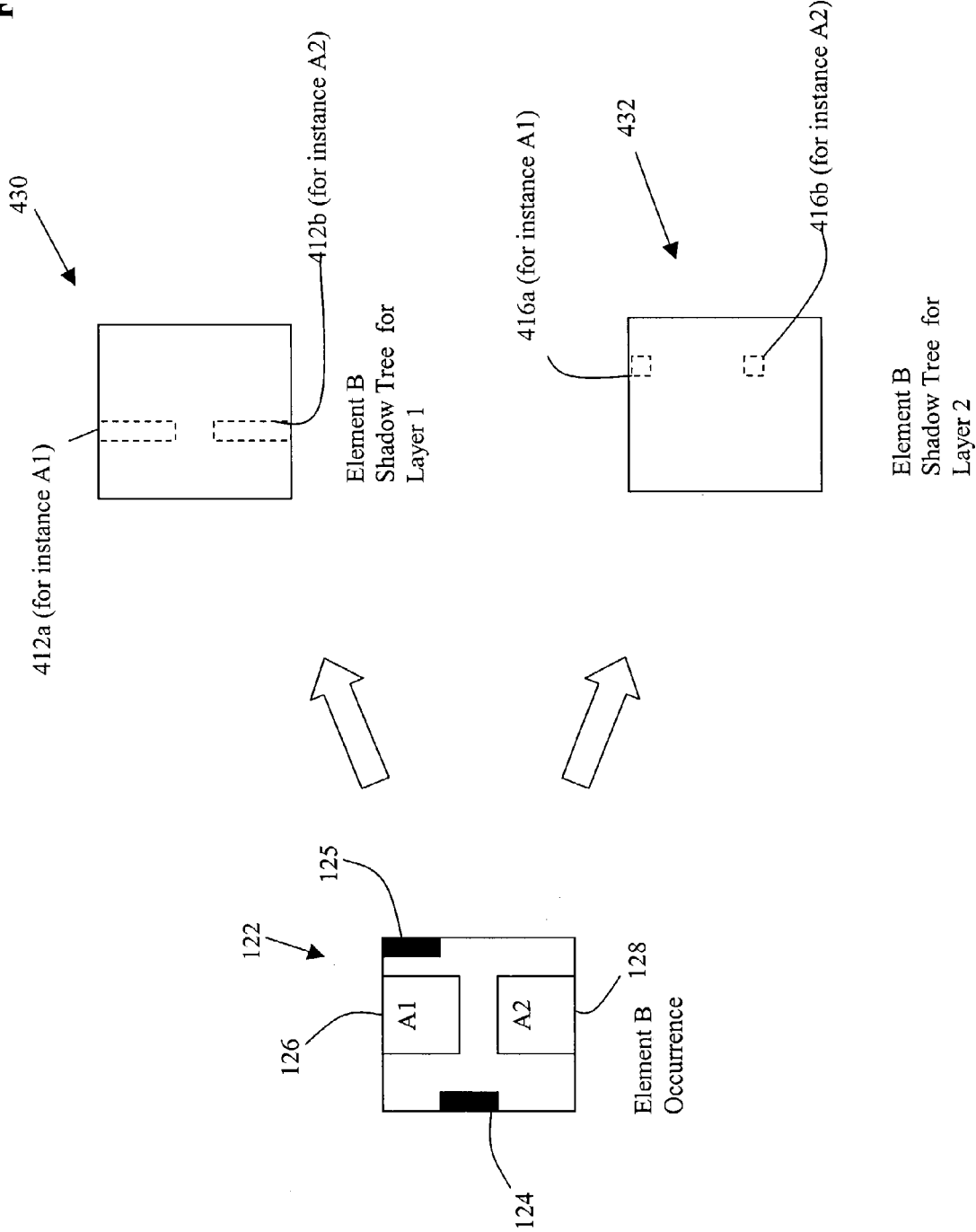

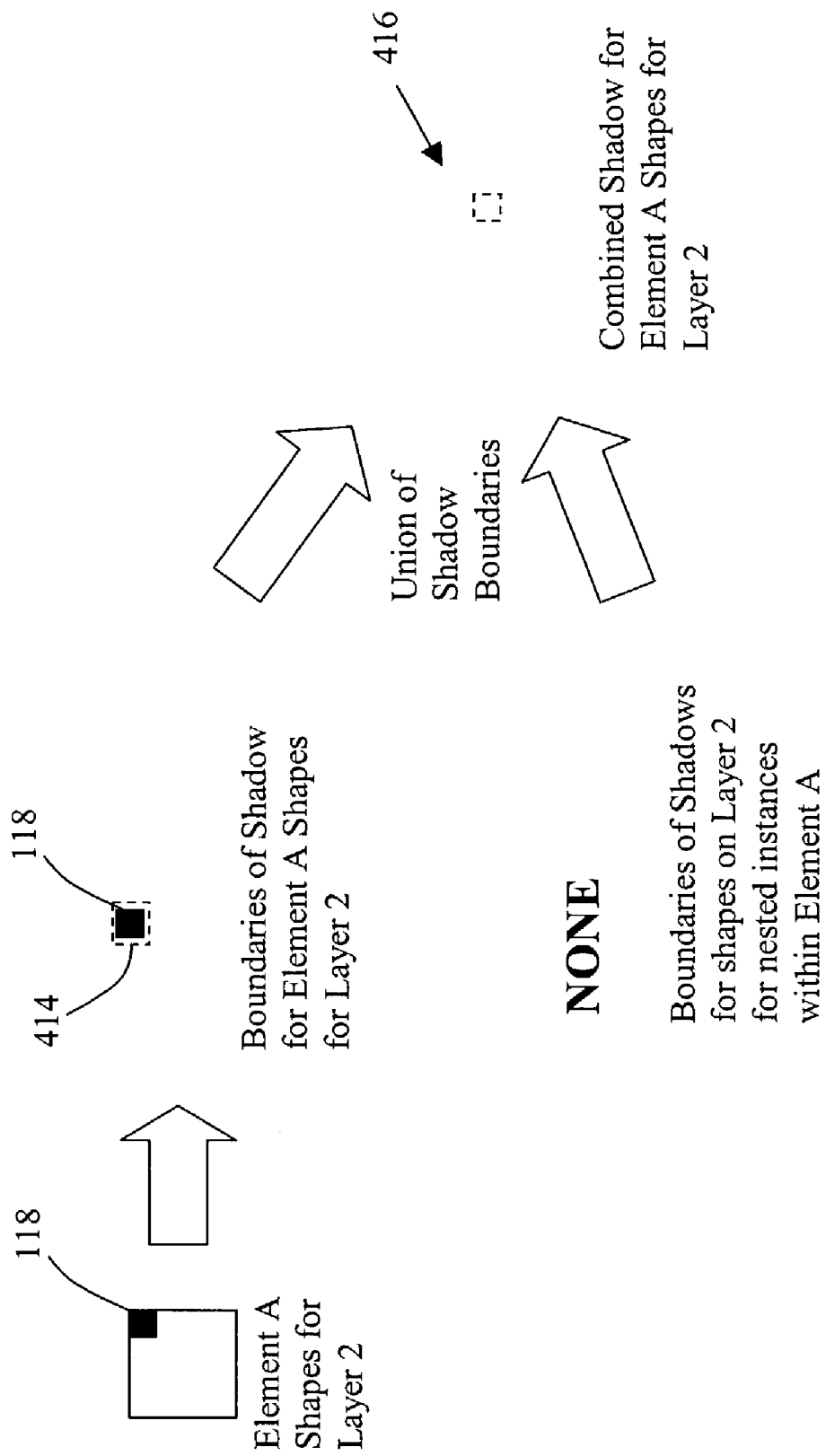

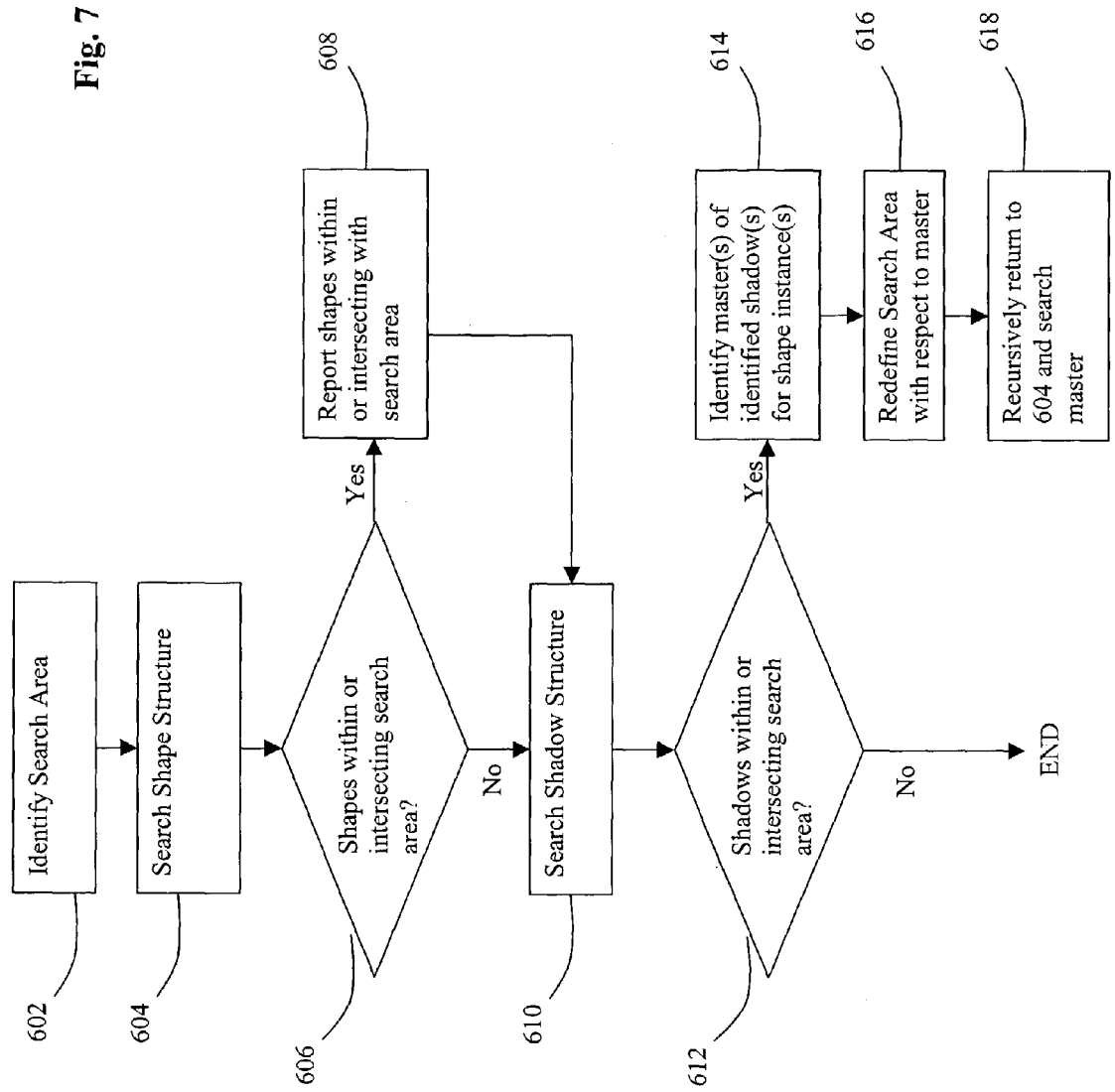

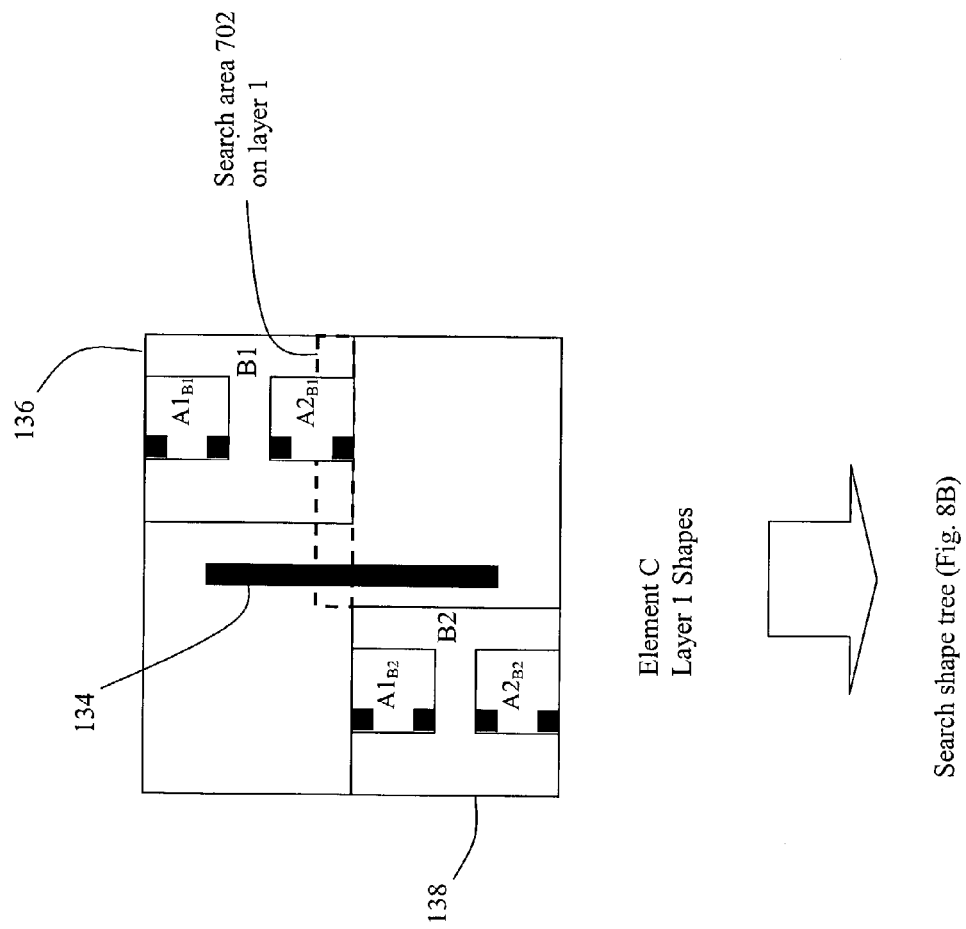

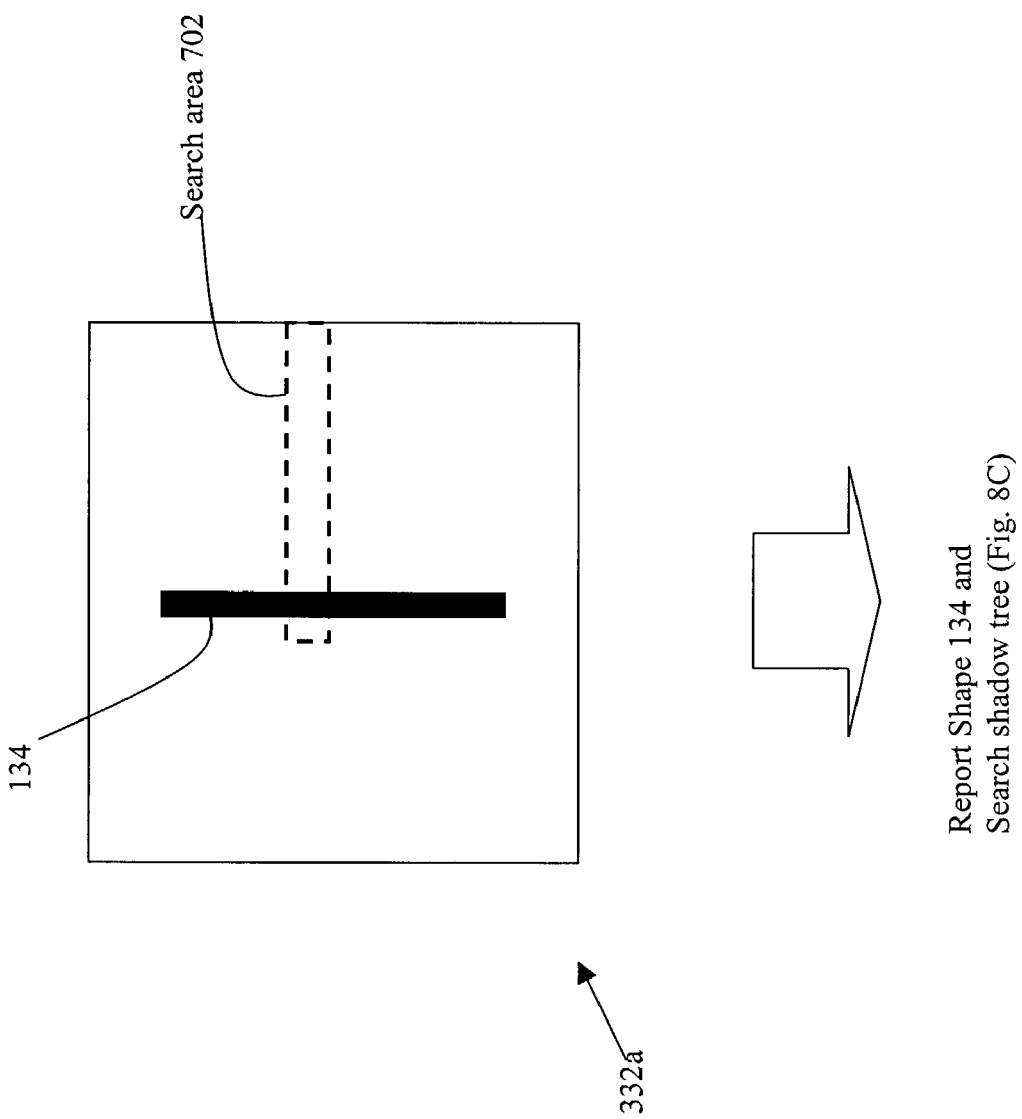

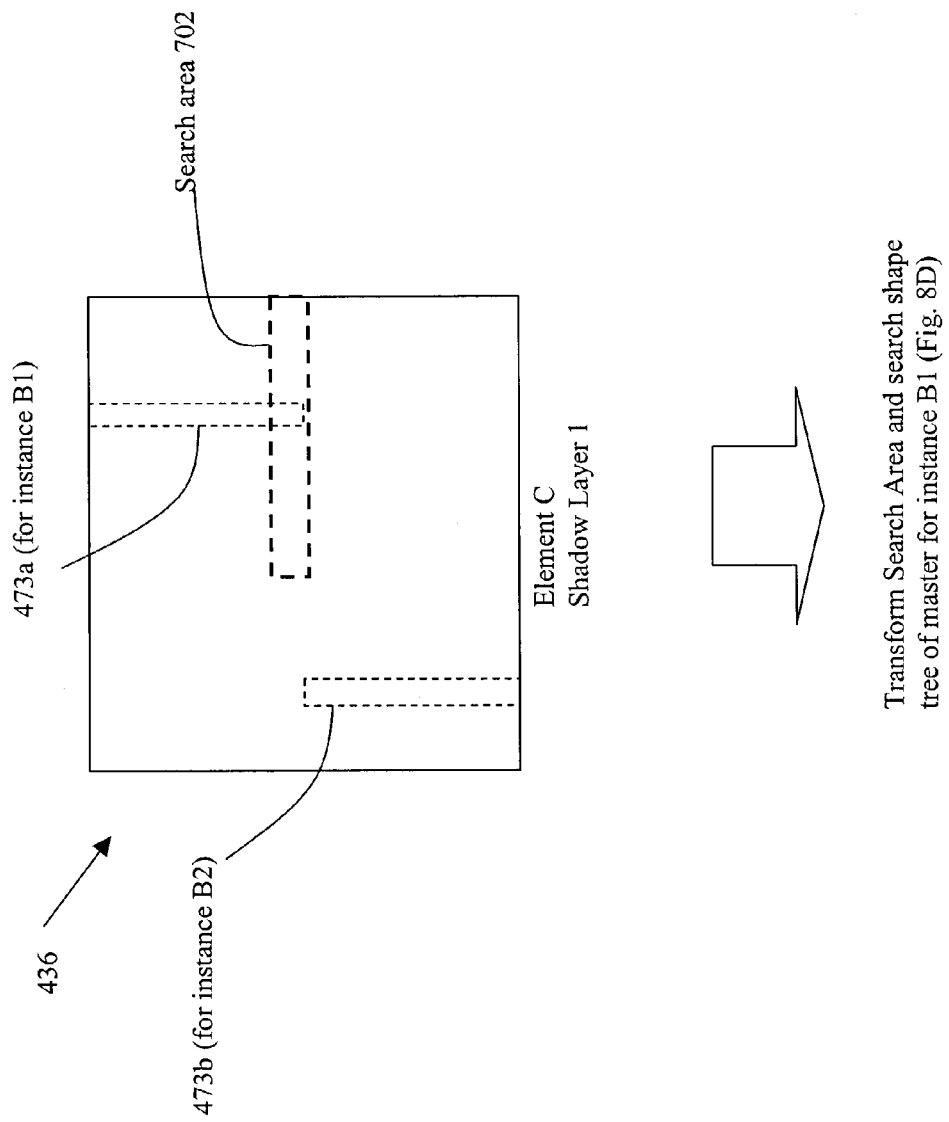

Fig. 8E
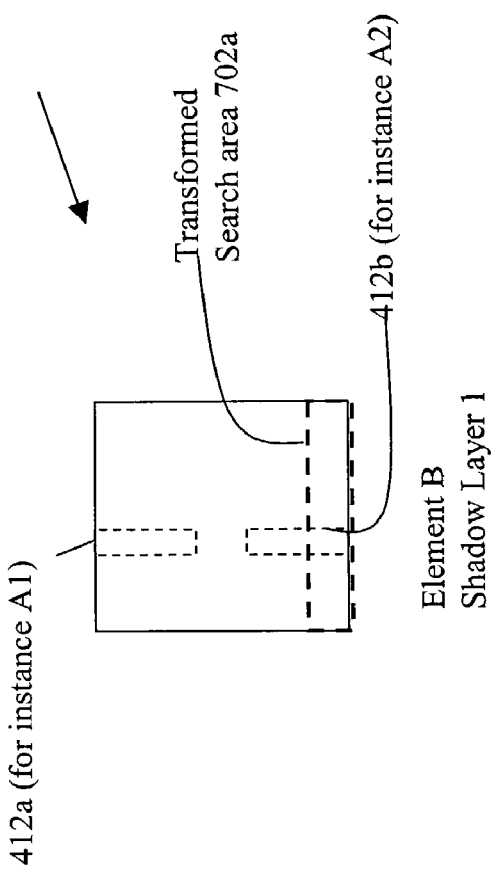
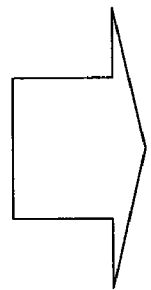
Transform Search Area and search shape tree of master for instance A2 (Fig. 8F)

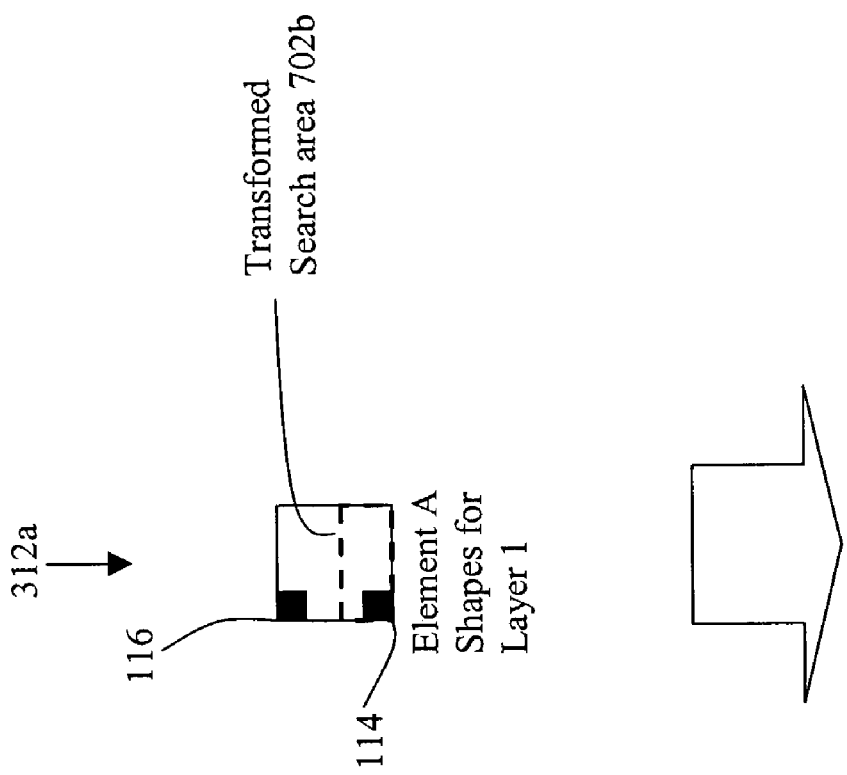

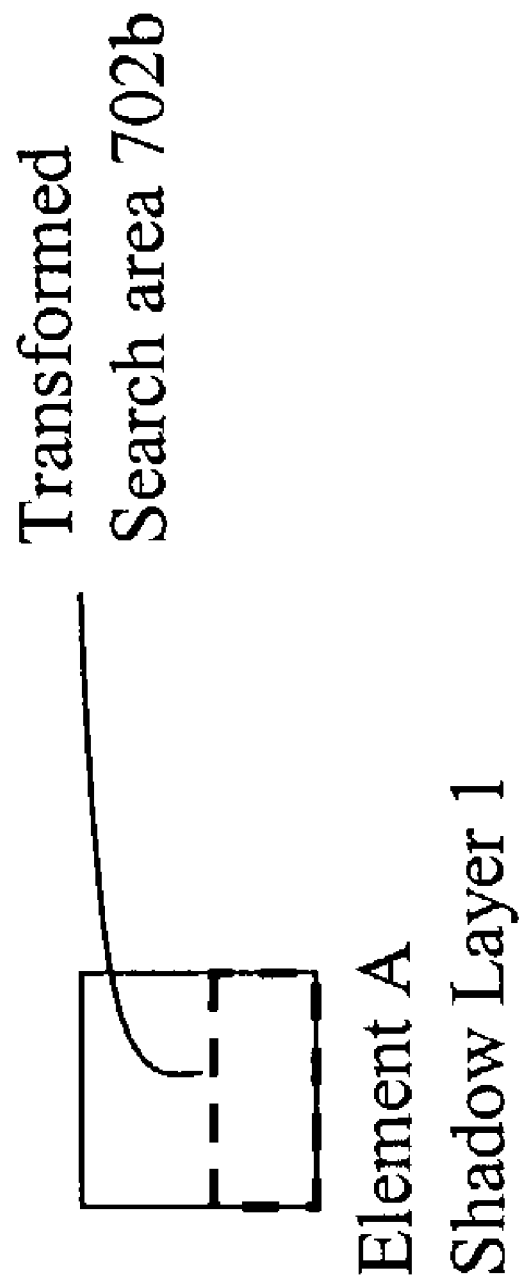

SHAPE ABSTRACTION MECHANISM

FIELD OF THE INVENTION

The present invention relates generally to electronic circuit design and manufacturing.

BACKGROUND OF THE INVENTION

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

IC layouts are often constructed in a hierarchical fashion, in which a master version or occurrence of a particular geometric element is created once, but where one or more instances of the geometric element may be inserted into various locations and levels within the IC design.

In this type of approach, the IC layout is hierarchically set out by re-using elements over and over again. Rather than copying duplicates of the same geometric element everywhere that it is used, instances of the elements are inserted in the appropriate locations that logically reference the appropriate master occurrence or version.

FIG. 1A shows an example design hierarchy, in which an occurrence 112 of element A comprises three shapes 114, 116, and 118. As used herein, occurrence is a master or reference copy of an element and an instance is an instantiation of an occurrence. At a different level in the IC design, an occurrence 122 of element B may be created that includes its own shapes 124 and 125, as well as two instances 126 and 128 of element A. At yet another level of the IC design, an occurrence 132 for element C may be created that includes a shape 134 as well as two instances 136 and 138 of element B. Instances 136 and 138 each contain instances of element A as shown in occurrence 122 (which are "nested instances"). In the hierarchy of FIG. 1A, each instance provides a logical reference to its master occurrence rather than a physical manifestation of the occurrence at the instance locations. Assume that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2.

An advantage of this approach is improved efficiency with respect to memory usage when storing design data for an IC design. Memory efficiencies are gained since instances of an element are used and placed in the design, rather than requiring a full copy of that element to be duplicated numerous times in the design data.

However, the hierarchical nature of this approach can also cause inefficiencies when attempting to access the design data. As just one example, consider the process to search a portion of the IC design for the shapes within a particular search area. The search area may encompass parts of one or more instances in the design. However, only a subset of the shapes within the instances may actually fall within the search area. Because the shapes are not actually stored at each level, the search process may need to traverse the entire hierarchy of the corresponding instances on every layer and their nested instances to confirm which shapes in the instances relate to the search area, even through portions of the hierarchy that do not contain any shapes at the correct layer or design area. Depending upon the complexity of the design, this could be a very lengthy and expensive process.

In an alternate approach, the design hierarchy can be flattened so that the design data is not hierarchical in nature. In this approach, rather than inserting instances of elements into the design, actual copies of the elements are placed in the appropriate locations within the design data.

FIG. 2 shows a flattened version of the design data shown in FIG. 1. Here, occurrence 122a for a flattened element B includes copies 126a and 128a of element A 112, rather than the instances 126 and 128 of element A shown in FIG. 1 that refers back to the master copy 112. Similarly, occurrence 132a for a flattened element C includes copies 136a and 138a of element B 122a, rather than instances that refer back to the master copy.

The advantage of this approach is that it is very efficient to search the flattened design data, since chains of instances do not need to be followed to identify shapes within a search area. However, if the design includes a large number of geometric elements, then this approach may also consume an excessive amount of memory and storage resources.

SUMMARY OF THE INVENTION

A method of representing a design of an electronic system having multiple layers includes, for each layer, storing a plurality of shape occurrences for the layer. A hierarchy of shape instances has a plurality of levels. Each shape instance corresponds to one of the shape occurrences. A hierarchy of shadow instances has a plurality of levels.

Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

FIGS. 3A–B illustrate examples of information stored in a shape tree according to one embodiment of the invention.

FIGS. 4, 5A–C, and 6A–C illustrate an embodiment of a process for determining shadow boundaries and shadow trees.

FIG. 7 is a flowchart of a process for searching an area of a layer of a design according to an embodiment of the invention.

FIGS. 8A–G and 9A–C illustrate an example process for searching an area of a layer of a design according to an embodiment of the invention.

DETAILED DESCRIPTION

The present invention is directed to an improved method and mechanism for managing and tracking geometric objects in an integrated circuit design. In one embodiment, the invention comprises a set of structures (referred to herein as "shape abstraction data structures") in which a hierarchical design structure is maintained but which provides many advantages of a flattened design. In this embodiment, the shape abstraction data structures store geometric information for shapes in each layer of the design and track the boundaries of shape instances ("shadows") at each layer.

In one embodiment, the shapes are tracked for each occurrence for each layer of the design. Any suitable data structure may be employed to track the shapes, e.g., using a tree structure, list structure, etc. As used herein, the term "shape tree" refers to a data structure for tracking the shapes on a layer for an occurrence.

Figure 1A:
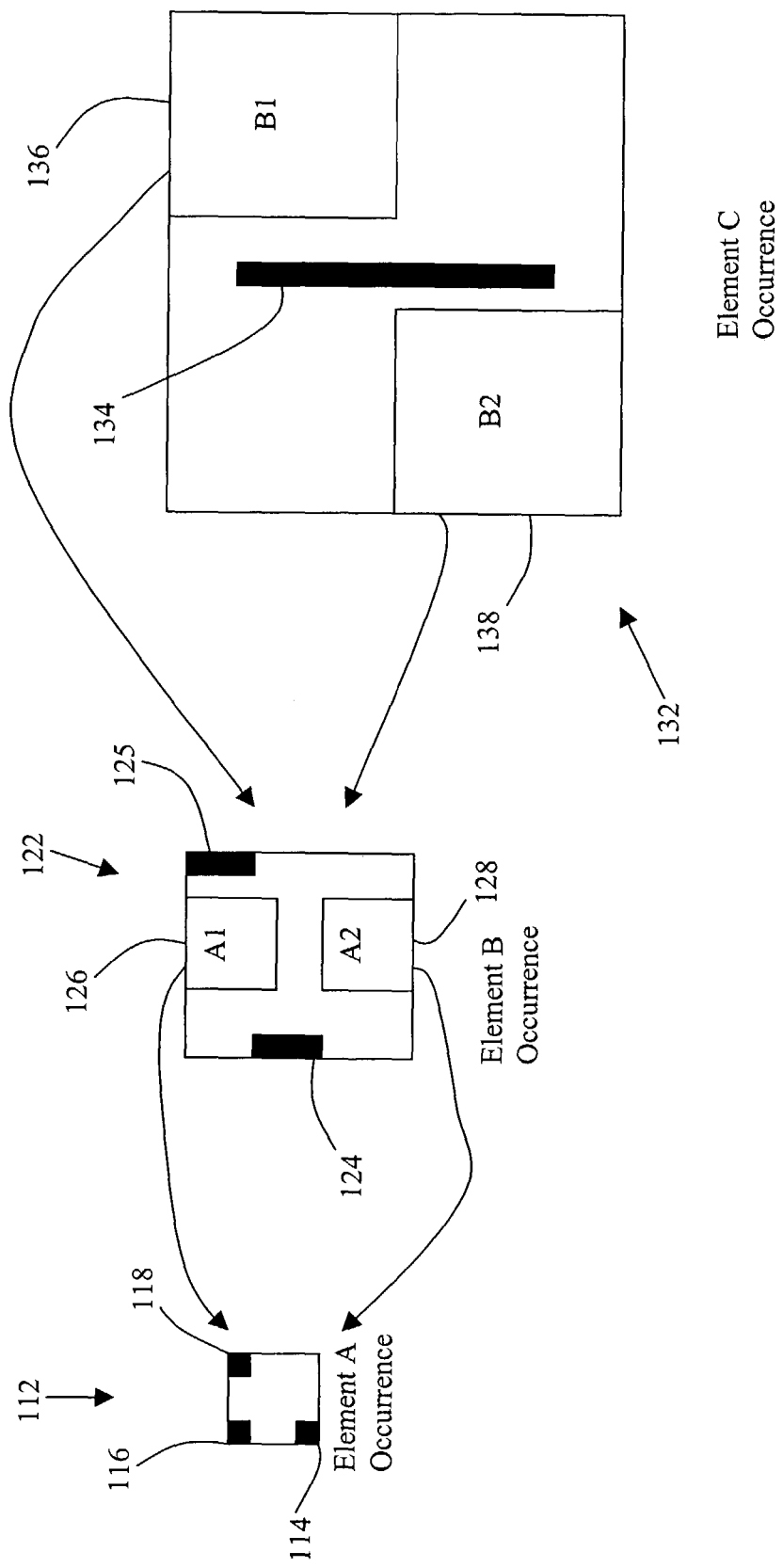
FIGS. 1A–C shows an example design hierarchy.
Figure 1B:
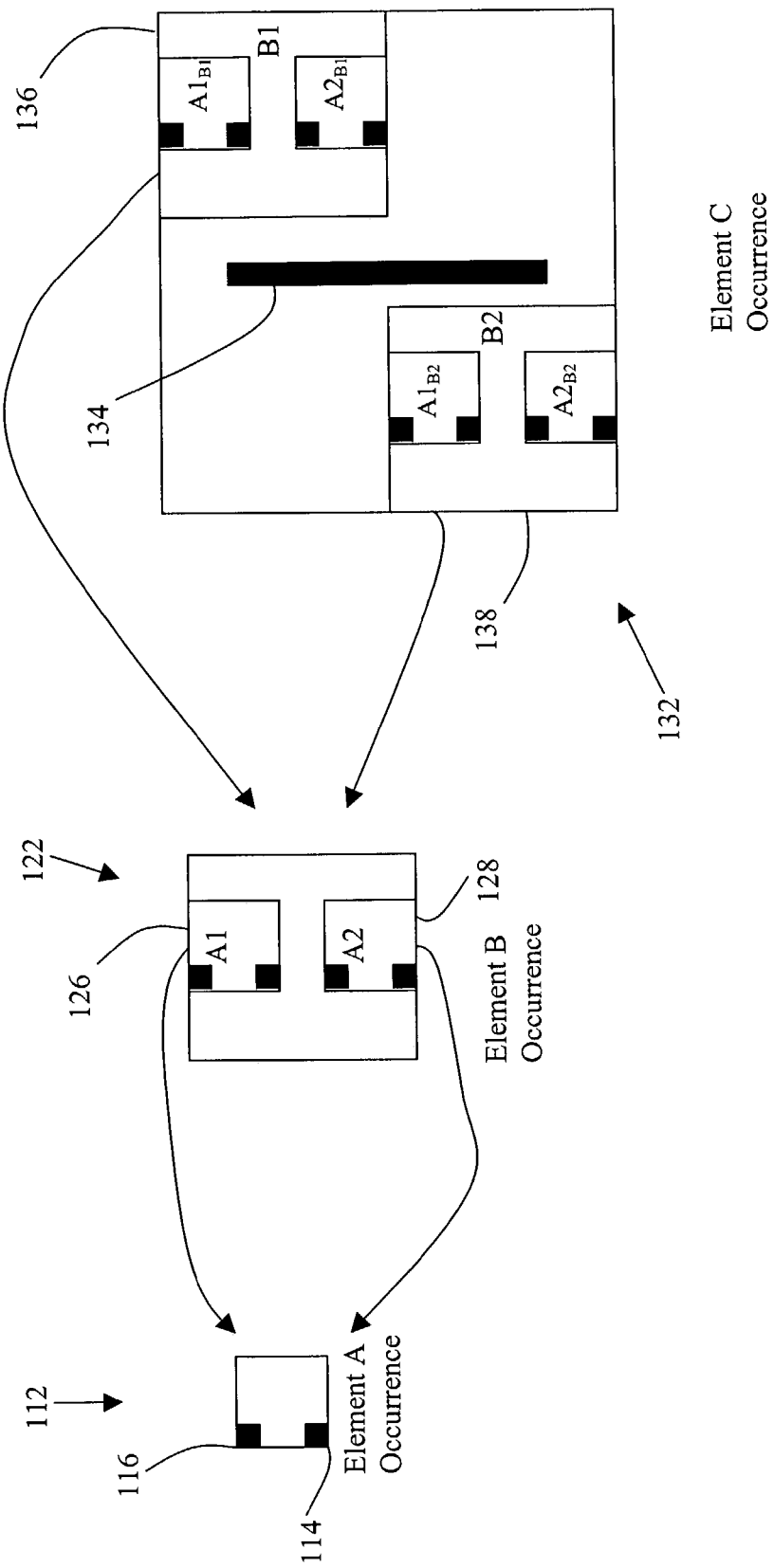
Figure 1C:
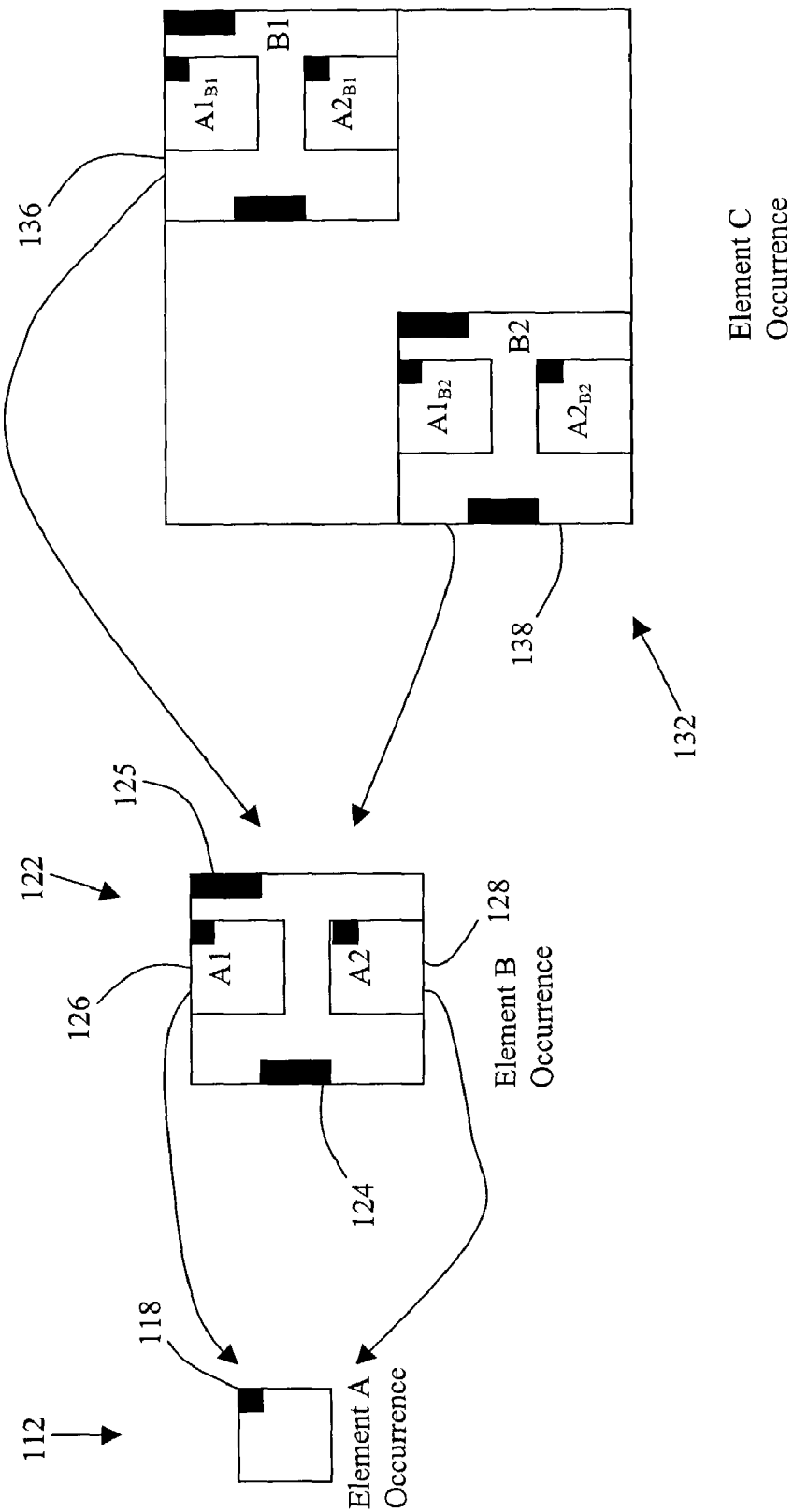
Figure 2:
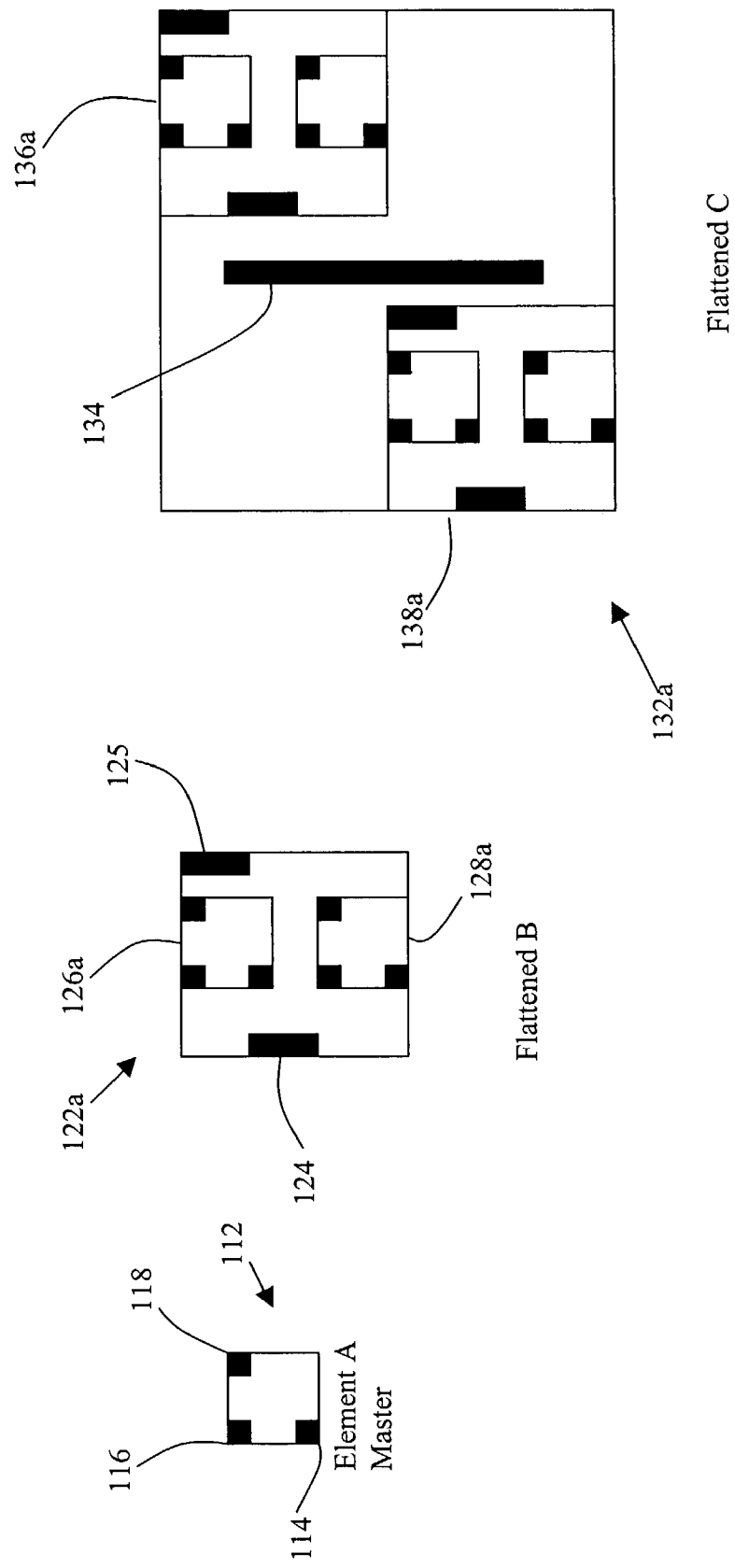
FIG. 2 shows an example of a flattened design hierarchy.

To illustrate and explain the invention, reference will be made to the design hierarchy of FIG. 1A. Recall that FIG. 1A shows an example design hierarchy, in which an occurrence 112 of element A comprises three shapes 114, 116, and 118. At a different level in the IC design, an occurrence 122 of element B may be created that includes its own shapes 124 and 125, as well as two instances 126 and 128 of element A. At yet another level of the IC design, an occurrence 132 for element C may be created that includes a shape 134 as well as two instances 136 and 138 of element B. It is assumed that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2. Each instance in the instance hierarchy points to a master data structure of the corresponding occurrence for the shape. The master data structure contains data, such as the bounds for the shape.

A first set of structures in the shape abstraction data structures is referred to herein as the shape trees, which track the native shapes on each layer for each geometric element. In the present embodiment, a separate shape tree is maintained for each occurrence for each layer. However, as is evident to those skilled in the art, other organizations of the data can also be used to implement the shape trees.

FIG. 3A illustrates the contents of the shape trees for layer 1 of the design hierarchy of FIG. 1A. Shape tree 312a tracks the shapes on layer 1 for element A, illustrating that element A includes shapes 114 and 116 on layer 1 at the indicated locations. Shape tree 322a tracks the shapes on layer 1 for element B, illustrating that element B does not have any native shapes on layer 1. Shape tree 332a tracks the shapes on layer 1 for element C, illustrating that element C includes a shape 134 on layer 1 at the indicated location.

FIG. 3B illustrates the contents of the shape trees for layer 2 of the design hierarchy of FIG. 1A. Shape tree 312b tracks the shapes on layer 2 for element A, illustrating that element A includes shape 118 on layer 2 at the indicated location. Shape tree 322b tracks the shapes on layer 2 for element B, illustrating that element B includes shapes 124 and 125 on layer 2 at the indicated locations. Shape tree 332b tracks the shapes on layer 2 for element C, illustrating that element C does not have any native shapes on layer 2.

Another set of structures (referred to herein as "shadow trees") is maintained to track the boundaries of the shape for instances ("shadows") at each layer. Each instance refers to a master structure that may include one or more shapes on one or more layers of the design. The shadow trees provide a structure that tracks the identity and location for the boundaries of the shapes referred to by instances in the design. Any suitable data structure may be used to track the information in the shadow trees, such as tree structures and list structures. In the present embodiment, a separate shadow tree is maintained for each occurrence for each layer. However, as is evident to those skilled in the art, other organizations of the data can also be used to implement the shadow trees.

The shadow tree for an occurrence on a layer is determined by identifying a "shadow" for shapes in the appropriate layer for the top-level instances in the element. Each top-level instance having shapes at the appropriate layer is associated with its own shadow. Each top-level instance may have its own nested instances. The boundary of the shadow for the instance is determined by performing a union of the coverage area for all shapes at the appropriate layer for that top-level instance with the coverage area of shapes at the layer in its nested instances.

Figure 4:
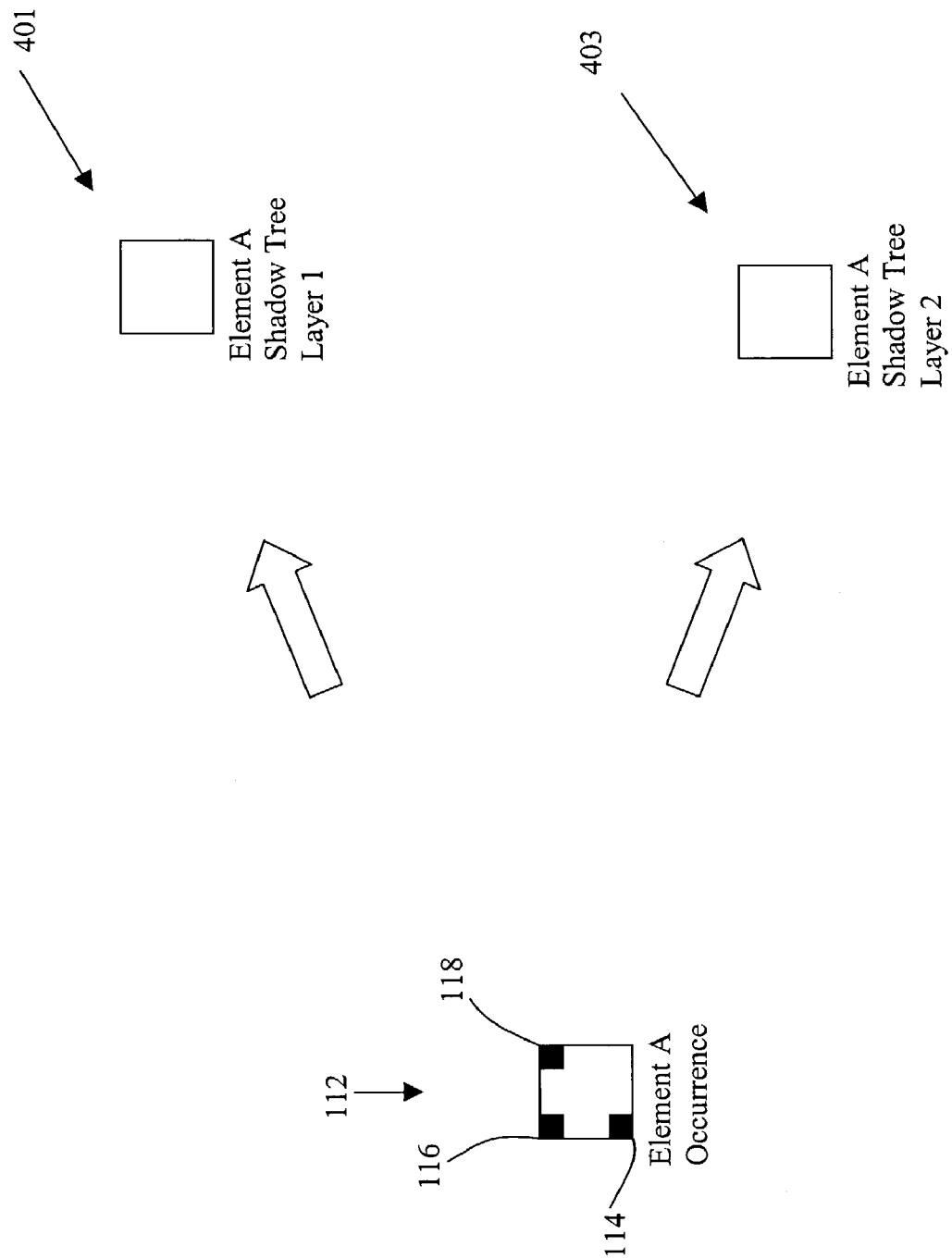

Referring to FIG. 4, shown are the contents of shadow trees that may be created for element A. The shapes in instances for element A at layer 1 would be represented in a layer 1 shadow tree 401 and the shapes in instances A at layer 2 would be represented in a layer 2 shadow tree 403. Here, since element A does not contain any instances, there are no instance shadows, at either layer 1 or layer 2, to populate the shadow trees for element A. Therefore, no shadows exist in shadow trees 401 and 403 for element A.

FIG. 5A illustrates the presently embodied process for forming shadow trees for occurrence 122 of element B. Occurrence 122 for element B includes two instances A1 126 and A2 128 of element A. The shadow trees for element B contain a shadow for each instance that contains shapes at the appropriate layer of the design. Each shadow tracks the boundaries of the shapes in the instance, and shapes in its nested instances, that exist on the appropriate layer of the design.

Shadow tree 430 tracks the boundaries of shapes on layer 1 for instances of element B. Here, shadow tree 430 contains a first shadow 412a corresponding to instance A1 and a second shadow 412b corresponding to instance A2.

Figure 5B:
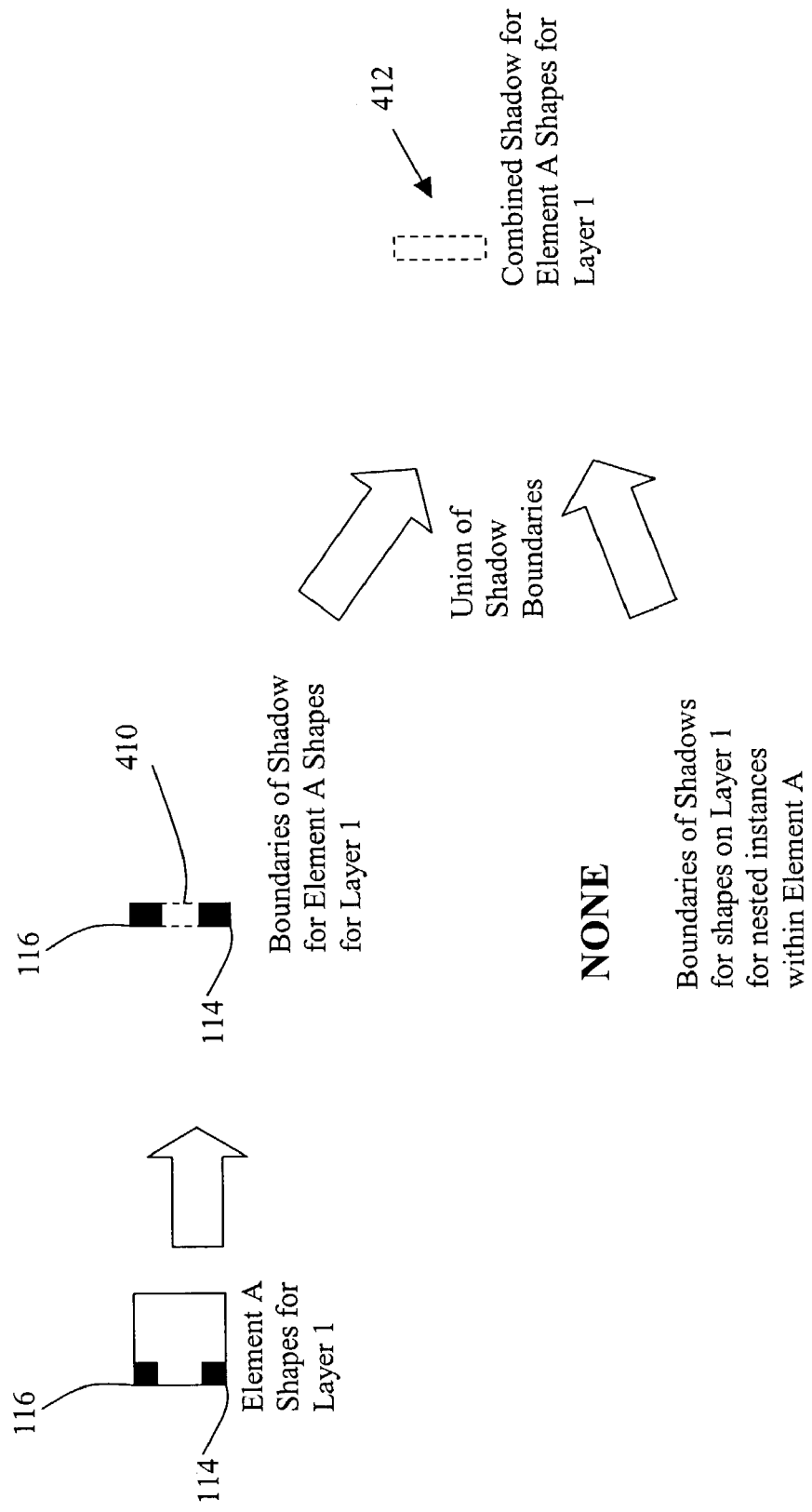

FIG. 5B illustrates an embodiment of a process for determining the boundaries and locations of the shadows 412a and 412b for the shapes of instances of element A at layer 2. The first action is to identify the native shapes for element A that exist on layer 1 of each instance. For this example, shapes 114 and 116 have been identified as being on layer 1 of element A (see FIG. 1B). A boundary is drawn around the identified shapes on the layer. In one embodiment, the boundary is a rectangle that is sized to fit around the boundary of all the identified shapes on the layer. Here, boundary 410 is a rectangular shape that matches and encompasses the outer boundaries of all the identified shapes 114 and 116 for element A on layer 1. Since shapes 114 and 116 are separated by a certain distance, the boundary 410 may encompass additional area within the geometric element. Next, identification is made of a boundary for all shapes for layer 1 within nested instances of element A. To identify the boundaries of the final shadow 412 for instances of element A, a union is performed between the boundary 410 of the native shapes in element A and the boundary of the shapes for nested instances within element A. Here, element A does not have any nested instances. Therefore, the coverage area and relative location of boundary 410 for the native shapes 114 and 116 in element A form the shadow 412 for element A on layer 1.

Shadow 412 is duplicated as shadow 412a in shadow tree 430 of FIG. 5A at a location relative to its positioning within instance A1. In like manner, shadow 412 is also duplicated as shadow 412b in shadow tree 430 at a location relative to its positioning within instance A2.

Shadow tree 432 in FIG. 5A tracks the boundaries of shapes on layer 2 for instances of element B. Here, shadow tree 432 contains a first shadow 416a corresponding to instance A1 and a second shadow 416b corresponding to instance A2.

FIG. 5C illustrates an embodiment of a process for determining the boundaries and locations of the shadows 416a and 416b for the shapes of instances of element A at layer 2. The first action is to identify the native shapes for element A that exist on layer 2 of each instance A1 and A2. Here, only shape 118 of element A has been identified as being on layer 2 (See FIG. 1C). Therefore, the boundary 414 that is drawn around native shapes at the top-level instance (i.e., shape 118) exactly matches the dimensions and relative location for shape 118 within element A. Next, identification is made of the boundary for all shapes on layer 2 within nested instances in element A, which will be combined with boundary 414 to form shadow 416. Here, element A does not have any nested instances. Therefore, the coverage area and relative location of boundary 414 for shape 118 forms the shadow 416 for element A on layer 2.

Shadow 416 is duplicated as shadow 416a in shadow tree 432 of FIG. 5A at a location relative to its positioning within instance A1. In like manner, shadow 416 is also duplicated as shadow 416b in shadow tree 432 at a location relative to its positioning within instance A2.

Figure 6A:
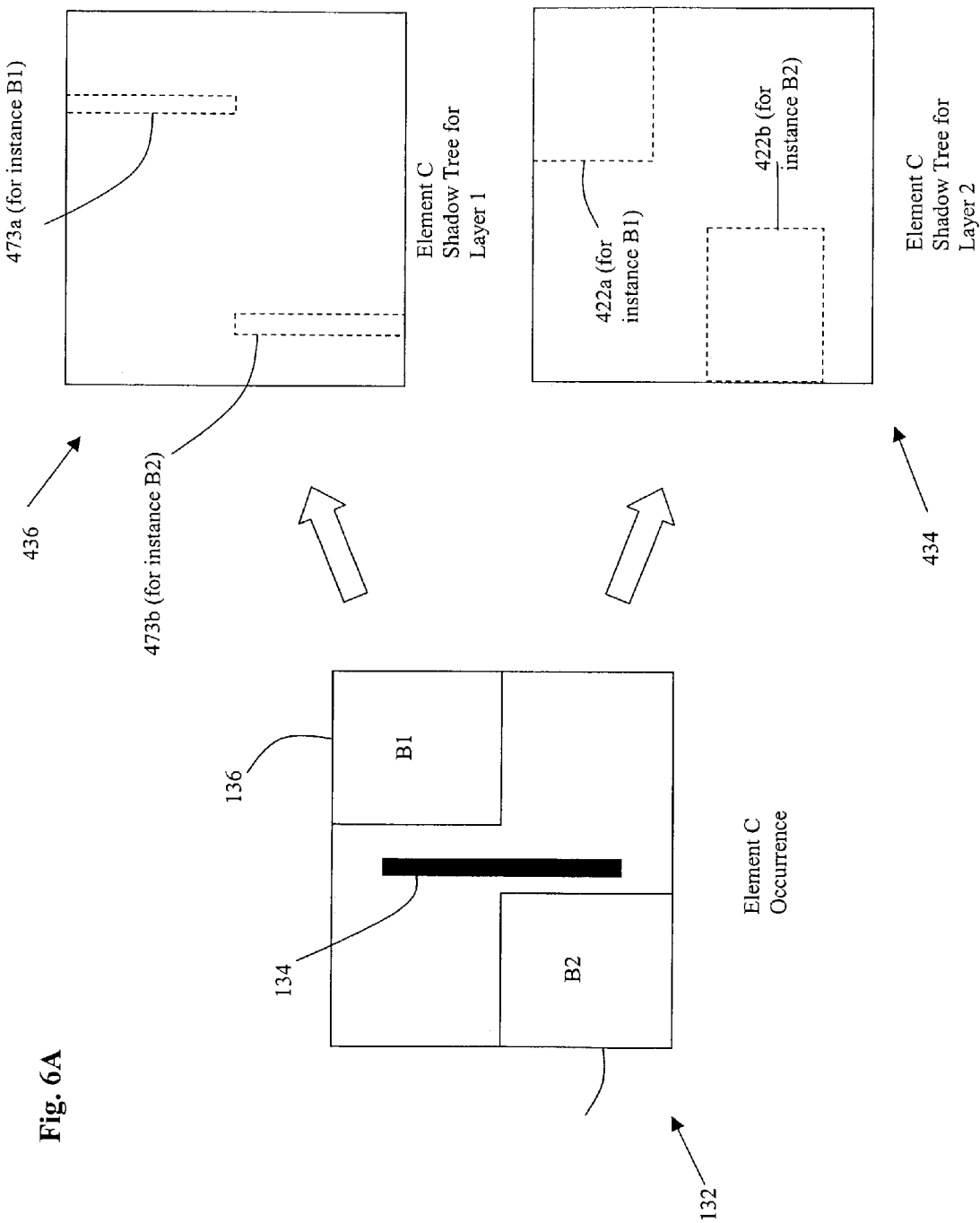

FIG. 6A illustrates the presently embodied process for forming shadow trees for occurrence 132 of element C. Occurrence 132 for element C includes two instances B1 136 and B2 138 of element B. The shadow trees for element C contain a shadow for each instance that contains shapes at the appropriate layer of the design. Each shadow tracks the boundaries of the shapes in the instance, and shapes in its nested instances, that exist on the appropriate layer of the design.

Shadow tree 436 tracks the boundaries of shapes on layer 1 for instances of element C. Here, shadow tree 436 contains a first shadow 473a corresponding to instance B1 and a second shadow 473b corresponding to instance B2.

Figure 6B:
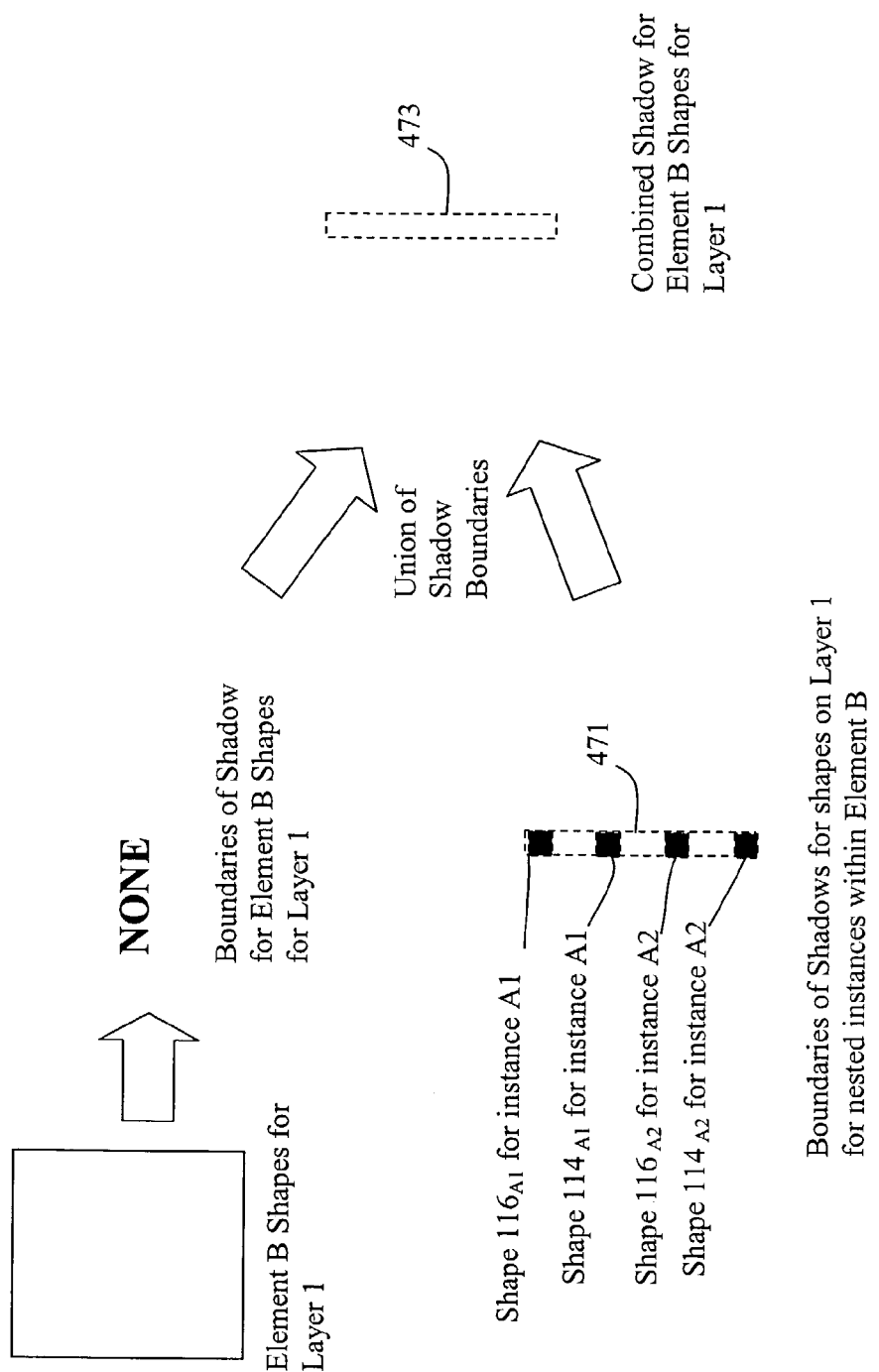

FIG. 6B illustrates an embodiment of a process for determining the boundaries and locations of the shadows 473a and 473b for the shapes of instances of element B at layer 1. The first action is to identify the native shapes for element B that exist on layer 1 of each instance. In this example, there are no native shapes for instances of element B on layer 1 (See FIG. 1B). Therefore, a shadow does not exist for native shapes for instances of element B on layer 1. Next, identification is made of the boundary for shapes on layer 1 for nested instances within instances of element B. Here, element B includes two instances of element A (element A1 and A2). Each instance A1 and A2 includes a shape 114 and a shape 116 on layer 1. Therefore, a boundary 471 exists for all the shapes $114_{A1}$, $116_{A1}$, $114_{A2}$, and $116_{A2}$ for nested instances A1 and A2. As before, the boundary can be drawn as a rectangle that is sized to fit around the outer boundaries of all the identified shapes, even if the boundary includes open area between the shapes. The shadow 473 for layer 1 of element B is formed from a union of the boundary for the native shapes and the boundary 471 for the shapes at layer 1 of nested instances. Here, since element B does not have any shapes on layer 1, the coverage area and relative location of boundary 471 for the nested instances form the shadow 473 for element B on layer 1.

Shadow 473 is duplicated as shadow 473a in shadow tree 436 of FIG. 6A at a location relative to its positioning within instance B 1. In like manner, shadow 473 is also duplicated as shadow 473b in shadow tree 436 at a location relative to its positioning within instance B2.

Shadow tree 434 tracks the boundaries of shapes on layer 2 for instances of element C. Here, shadow tree 434 contains a first shadow 422a corresponding to instance B1 and a second shadow 422b corresponding to instance B2.

Figure 6C:
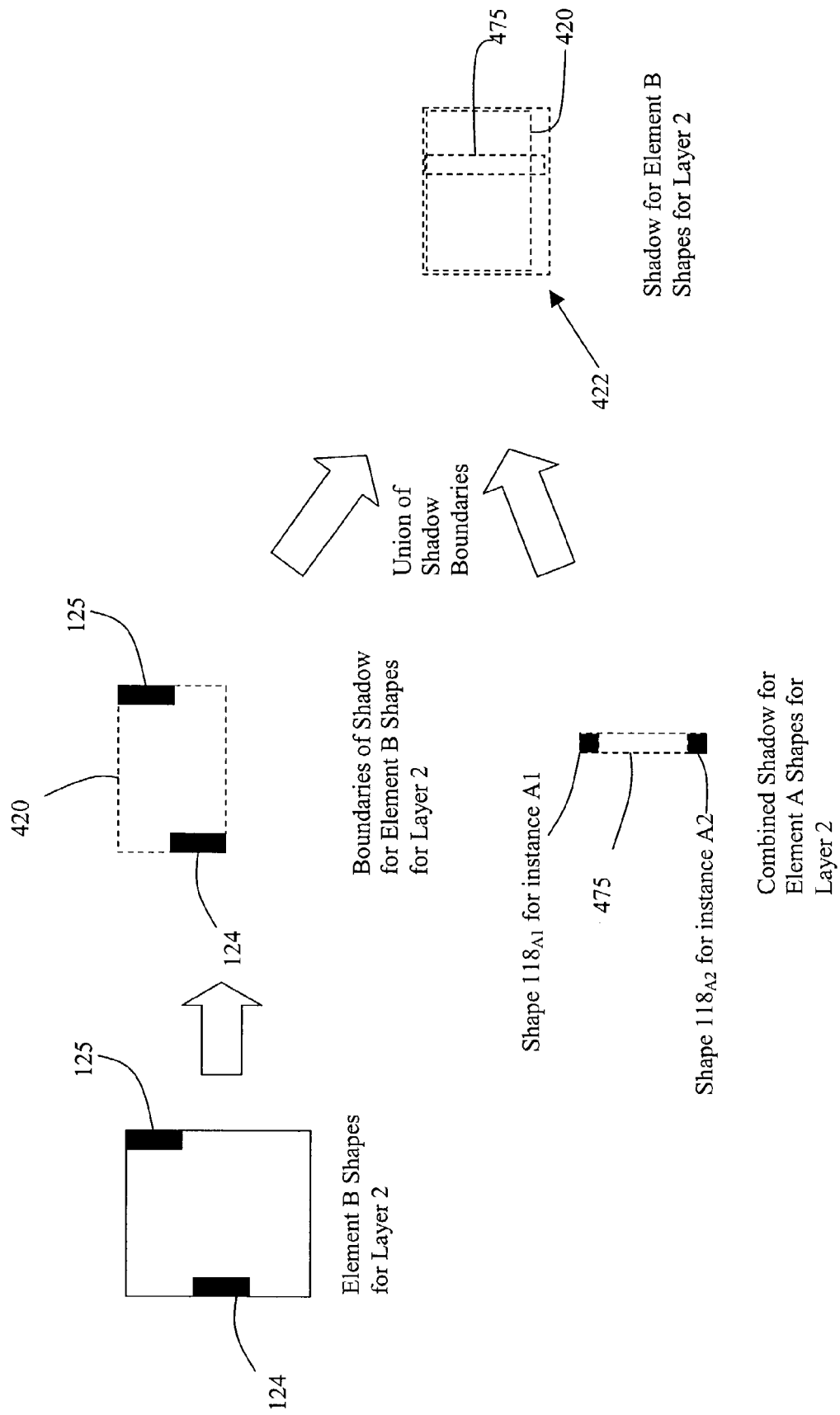

FIG. 6C illustrates an embodiment of a process for determining the boundaries and locations of the shadows 422a and 422b for the shapes of instances of element B at layer 2. The first action is to identify the native shapes for element B that exist on layer 2 of each instance B 1 and B2. Shapes 124 and 125 have been identified as natively being on layer 2 of instances of element B. A boundary 420 is drawn around the identified shapes 124 and 125 on the layer. Here, boundary 420 is a rectangular shape that matches and encompasses the outer boundaries of all the identified shapes 124 and 125 for element B on layer 2. Since a distance separates shapes 124 and 125, the boundary 420 encompasses additional area within the geometric elements of the two shapes.

Next, identification is made of the boundary for shapes on layer 2 for nested instances within element B. Here, element B includes two instances of element A (element A1 and A2). Each instance A1 and A2 includes a shape 118 on layer 2. Therefore, a shadow boundary 475 exists surrounding the outer boundaries of shapes $118_{A1}$, and $118_{A2}$ for nested instances A1 and A2.

The shadow 422 for layer 2 shapes of element B is defined from a union of the boundary 420 for the native shapes and the boundary 475 for the shapes of nested instances within layer 2. As before, the boundary can be drawn as a rectangle that is sized to fit around the outer boundaries of all the identified shapes, even if the boundary includes open area between or around the shapes. Shadow 422 is duplicated as shadow 422a in shadow tree 434 of FIG. 6A at a location relative to its positioning within instance B1. In like manner, shadow 422 is also duplicated as shadow 422b in shadow tree 434 at a location relative to its positioning within instance B2.

FIG. 7 shows a flowchart of an embodiment of a method to identify or search for objects within a layer of a design when using the disclosed shape abstraction data structures. A desired region or area of a given layer to be searched is defined (602). Shapes within or intersecting with the search area on the desired level are identified. In one approach, this is performed by searching the appropriate shape tree for the object or area being searched (604). A determination is made whether any shapes exist within or intersect with the search area (606). If so, then the identified shapes are reported as being within the search area (608). One exemplary approach for identifying geometric objects within a given search area is described in co-pending application U.S. Ser. No. 10/342,823 entitled, "Zone Tree Method and Mechanism", filed on Jan. 14, 2003, which is hereby incorporated by reference in its entirety.

Next, the shapes for instances within the search area are identified. In one approach, this is performed by searching the appropriate shadow tree for the object or area being searched (610). A determination is made whether any shadows exist within or intersect with the search area (612). If so, then identification is made of the master structure(s) for the identified shadow(s) (614). The search area is re-defined to cover the corresponding portions of each identified master structure (616). For each identified master, the process recursively returns back to 604 to identify shapes associated within the re-defined search area of the master (618).

Figure 8D:
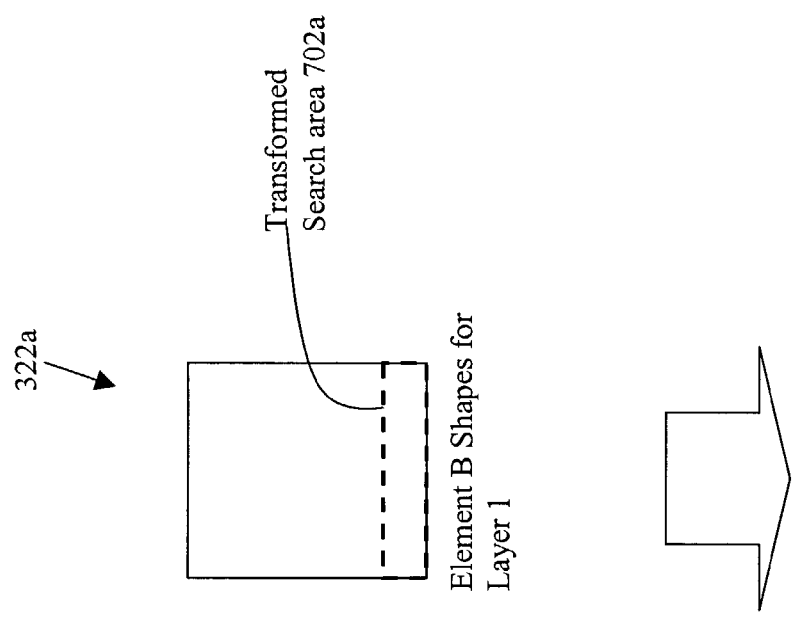

FIGS. 8A–G illustrate an example of this process for identifying objects within a search area. FIG. 8A shows a search area 702 that has been defined for layer 1 to search for shapes within element C. A search of the shape tree is performed. To depict a search of the shape tree, FIG. 8B shows the search area 702 overlaid on the shape tree 332a (FIG. 3A) for layer 1 of element C. Here, it can be seen that shape 134 intersects with the boundaries of search area 702. Therefore, the process reports shape 134 as being within/intersecting with the search area.

Next, the shadow tree is searched with respect to the search area 702. Referring to FIG. 8C, shown is the search area 702 overlaid onto the visualization of shadow tree 436 (FIG. 6A) for layer 1 of element C. Here, it can be seen that shadow 473a intersects with the boundaries of the search area 702.

The shadow 473a is identified as being associated with instance B1. Therefore, the next action is to transform the search area 702 relative to its corresponding portion of the master for instance B1, and then recursively perform a search for shapes within that re-defined search area 702a for the master structures for instance B1 at the appropriate layer.

A search of the shape tree 322a (FIG. 3A) for the master of instance B1 is performed. To depict a, search of the shape tree, FIG. 8D shows the re-defined search area 702a overlaid on the shape tree 322a for layer 1 of element B. Here, it can be seen that no shapes exist in the shape tree 322a for element B within the re-defined search area 702a.

Next, the shadow tree for layer 1 of element B is searched with respect to the search area 702a. Referring to FIG. 8E, shown is the search area 702a overlaid onto the visualization of shadow tree 430 (FIG. 5A) for layer 1 of element B. Here, it can be seen that shadow 412b intersects with the boundaries of the search area 702a.

The shadow 412b is identified as being associated with instance A2 of element B. Therefore, the next action is to transform the search area 702a relative to its corresponding portion of the master for instance A2, and then recursively perform a search for shapes within that re-defined search area 702b for the master structures for instance A2 at the appropriate layer.

A search of the shape tree 312a (FIG. 3A) for the master of instance A2 is performed. To depict a search of the shape tree, FIG. 8F shows the re-defined search area 702b overlaid on the shape tree 312a for layer 1 of element A. Here, it can be seen that shape 114 falls within the boundaries of search area 702b. Therefore, the process reports shape 114 as being within/intersecting with the search area.

Next, the shadow tree for layer 1 of element A is searched with respect to the search area 702b. Referring to FIG. 8G, shown is the search area 702b overlaid onto the visualization of the shadow tree 401 (FIG. 4) for layer 1 of element B. Here, it can be seen that no shadows within shadow tree 401 intersect with the boundaries of the search area 702b. Therefore, the process ends unless additional recursive searches still need to be performed for shadows that have been previously identified.

Figure 9A:
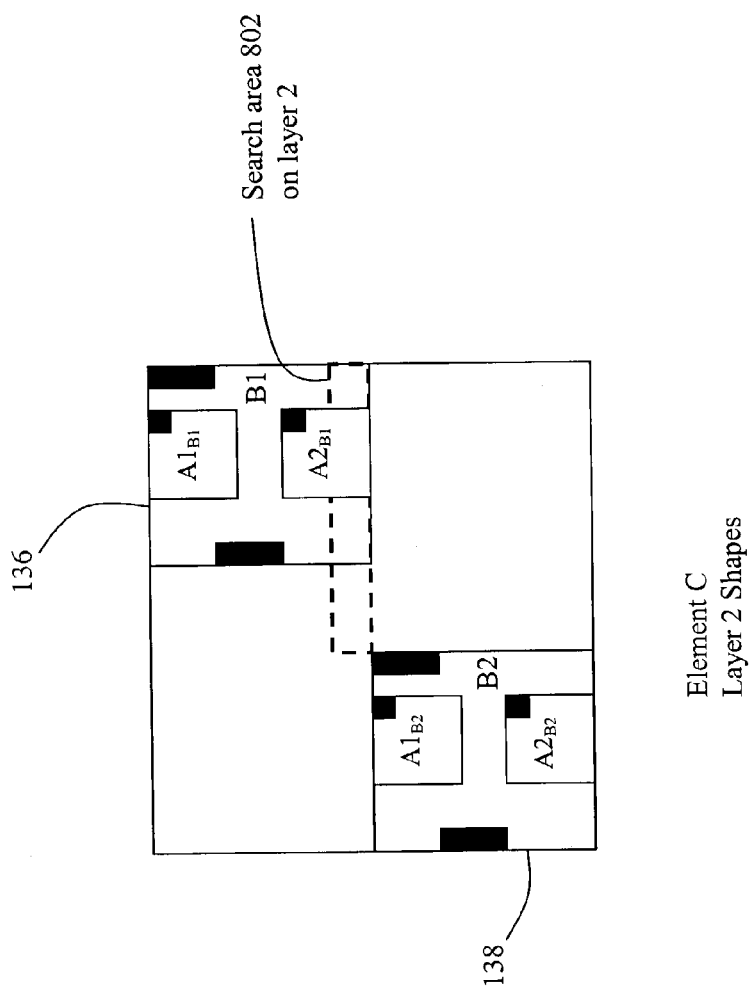
Figure 9B:
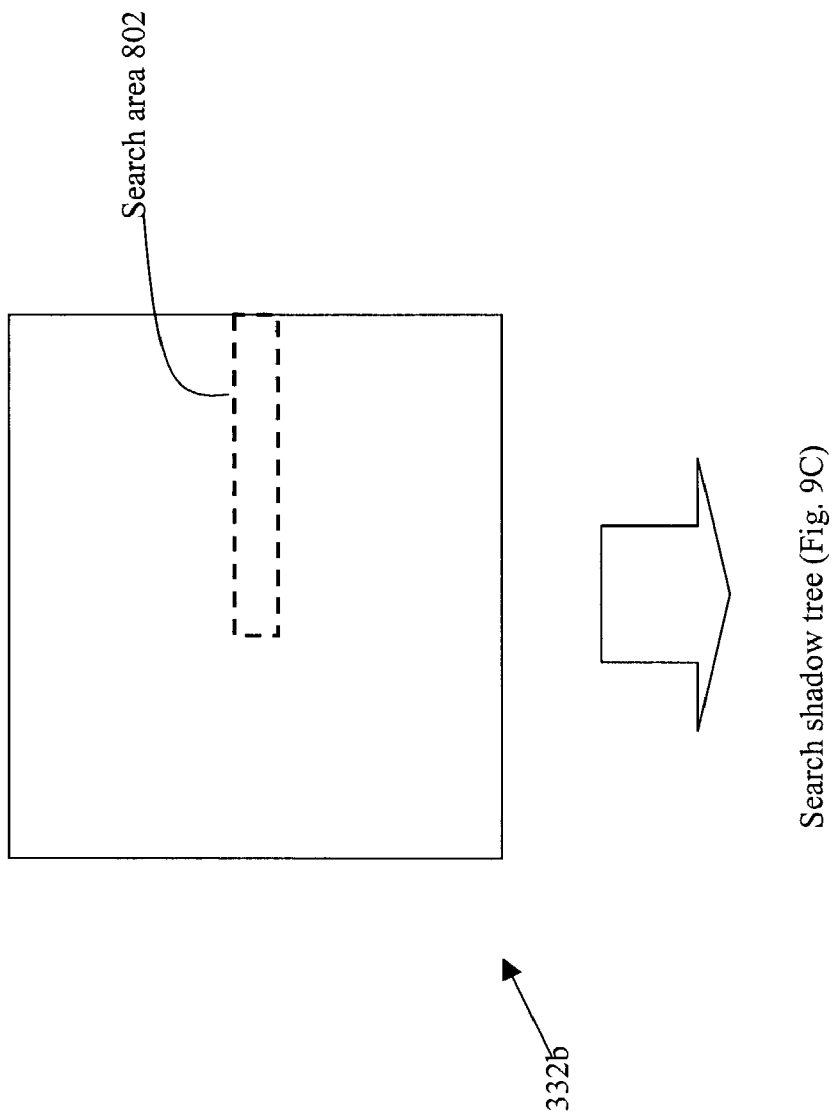

Next, assume that the search is for objects on layer 2 of geometric element C. FIG. 9A shows a search area 802 that has been defined for layer 2 to search for shapes within element C. A search of the appropriate shape tree is performed. To depict a search of the shape tree, FIG. 9B shows the search area 802 overlaid on the shape tree 332b (FIG. 3A) for layer 2 of element C. Here, it can be seen that the boundaries of search area 802 do not intersect any shapes within shape tree 332b. Therefore, the process does not report any shapes at this time.

Figure 9C:
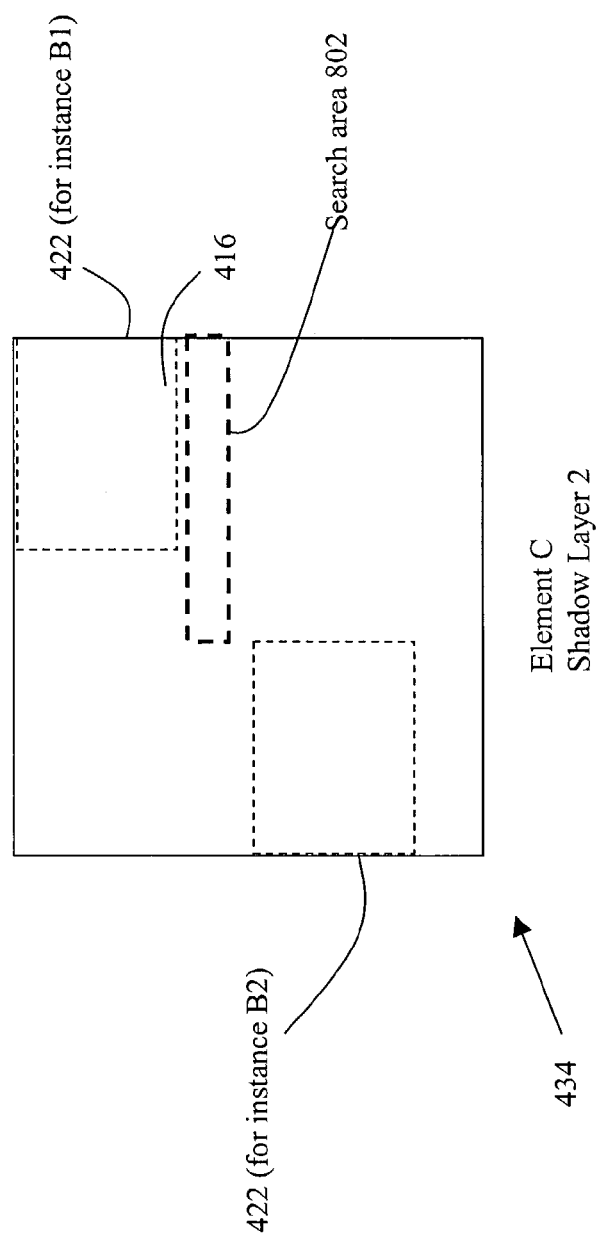

The shadow tree for layer 2 is then searched with respect to the search area 802. Referring to FIG. 9C, shown is the search area 802 overlaid onto a visualization of the shadow tree 434 (FIG. 6A) for layer 2 of element. Here, it can be seen that no shadows within shadow tree 434 fall within or intersect the boundaries of the search area 802. Therefore, no shapes are reported as being within the search area on layer 2.

Note that this search area over layer 2 of element C does not return any found objects, despite the fact that the search area actually encompasses a portion of instance B1 136 (as can be seen on FIG. 9A). Because the shadow tree is configured to track only the actual boundaries of shapes for instances on the specified layer, and no shapes exist within the search area on layer 2 of element C, the search does not return any found objects. This highlights a significant advantage of the present embodiment of the invention, which can greatly reduce unnecessary searching of hierarchical elements that do not have shapes in the search area within the layer being searched.

Therefore, what has been described is a method and mechanism for managing and tracking objects in an integrated circuit design. The present invention may be embodied as any combination of software, hardware, computer usable medium, or manual operations. In one specific embodiment, the invention is embodied as an EDA software tool for placing and/or routing integrated circuit designs.

These and other embodiments of the present invention may be realized in accordance with the above teachings and it should be evident that various modifications and changes may be made to the above-described embodiments without departing from the broader spirit and scope of the invention. The specification and drawings are, accordingly, to be regarded in an illustrative rather than restrictive sense and the invention measured only in terms of the claims.

What is claimed is:

1. A method of representing a design of an electronic system having multiple hierarchial levels dispersed over multiple physical layers, the method comprising:
   for each physical layer, storing one or more master copies of elements for the physical layer;
   generating a hierarchy of instances of shapes having n levels, where n is an integer greater than or equal to 1, each instance of a shape corresponding to one of the master copies of elements; and
   for each physical layer, generating a hierarchy of shadows having the n levels, each shadow tracking a set of boundaries for one or more shapes from one or more levels of the n levels in the hierarchy of instances of shapes that exist on each layer of the design.

2. The method of claim 1 wherein generating a first level for the hierarchy of instances of shapes comprises:
   generating a first instance of a shape corresponding to a first master copy.

3. The method of claim 2, wherein generating a second level for the hierarchy of instances of shapes comprises:
   generating a second instance of a shape corresponding to a second master copy; and
   including one or more of the first instances in the second instances.

4. The method of claim 3, wherein generating an instance of a shape for a second level of the hierarchy of instances of shapes comprises:
   determining a first shadow based on the union of bounds for elements of the master copy corresponding to the first level instance of a shape;
   replacing each of the first instances of shapes in the second master copy with the first shadow to generate a second level shadow.

5. The method of claim 4, wherein generating a third level shadow comprises:
   determining a second shadow based on the union of bounds for elements of the master copy corresponding to the second level instance of a shape and the first shadow;
   replacing each of the second instances of shapes in a third master copy with the second shadow to generate a third level master copy.

6. The method of claim 1, wherein generating a shadow for level n comprises:
   determining a shadow based on the union of bounds for elements of the master copy corresponding to the instance of a shape for level n-1;
   replacing each of the level n-1 instances of shapes in the $n^{th}$ master copy with the shadow to generate the level n shadow.

7. A structure for representing an integrated circuit design, the integrated circuit design having a hierarchy of design elements dispersed over a plurality of physical layers, the structure comprising:
   a first structure that represents one or more shapes in an occurrence of a hierarchical element that are located in one of the plurality of physical layers in the integrated circuit design; and
   a second structure that represents one or more boundaries of instance shapes, the instance shapes corresponding to one or more shapes in one or more instances that are located in one of the plurality of physical layers in the integrated circuit design, the one or more instances associated with the occurrence of the hierarchical element.

8. The structure of claim 7, wherein the first structure further comprises:
   levels of nested instances of shapes in the first layer.

9. The structure of claim 7, wherein the second structure further comprises:
   a representation of shape boundaries for each instance.

10. A method for representing an integrated circuit design, the integrated circuit design having a hierarchy of design elements dispersed among plurality of physical layers, the method comprising:
    maintaining a first structure that represents one or more shapes of an occurrence of a hierarchical element that are located in one of the plurality of physical layers in the integrated circuit design; and
    maintaining a second structure that represents one or more boundaries of instance shapes, the instance shapes corresponding to one or more shapes in one or more instances that are located in one of the plurality of physical layers in the integrated circuit design, the one or more instances associated with the occurrence of the hierarchical element.

11. The method of claim 10, wherein maintaining the first structure further comprises:
    maintaining nested instances of shapes in the one layer.

12. The method of claim 10, wherein maintaining the second structure further comprises:
    maintaining a representation of shape boundaries for each instance.

13. A method of analyzing a physical layer of an electronic design comprising:
    (a) determining a search area;
    (b) selecting a level from a plurality of levels in the hierarchy as the current level for one layer of a plurality of layers in the electronic design;
    (c) identifying shapes within the search area corresponding to the current level instance of a shape; and
    (d) determining whether shapes are within the search area by searching a current level shadow, each shadow tracking a set of boundaries for one or more shapes from one or more levels in a hierarchy of instances of shapes that exist on each layer of the design.

14. The method of claim 13, further comprising:
    (f) identifying one or more shapes from the current level shadow; and
    (g) replacing the current level with a lower level.

15. The method of claim 13, further comprising:
    (h) repeating (a) through (g) until no further shadows intersect the search area are to be searched.

16. A method for searching a representation of an integrated circuit design, the integrated circuit design having a hierarchy of design elements dispersed over a plurality of physical layers, the method comprising:
    (a) identifying a search area;
    (b) searching a first structure that represents one or more shapes an occurrence of a hierarchical element that are located in one of the plurality of physical layers in the integrated circuit design; and
    (c) searching a second structure that represents zero or more boundaries of instance shapes, the instance shapes corresponding to one or more shapes in one or more instances that are located in one of the plurality of physical layers in the integrated circuit design, the one or more instances associated with the occurrence of the hierarchical element.

17. The method of claim 16, wherein searching the first structure further comprises:

(d) searching one or more levels of nested instances of shapes in the second structure.

18. The method of claim 17 in which step (d) is performed by recursively performing steps (a)–(c).

19. The method of claim 17 in which the search area is redefined when searching each nested instance.

20. The method of claim 17 in which the search area intersects for encompasses boundaries associated with the one or more levels of nested instances.

21. The method of claim 16 further comprising the act of reporting any shapes identified in step (b) that intersect or fall within the search area.

22. The method of claim 16, wherein searching the second structure further comprises:
    searching a representation of shape boundaries for each instance.

23. A structure for representing an integrated circuit design, the integrated circuit design having a hierarchy of design elements dispersed over a plurality of physical layers, the structure comprising:
    a first shape structure, the first shape structure representing shapes in a first layer of a master copy of a hierarchical element in the integrated circuit design;
    a second shape structure, the second shape structure representing shapes at a second layer of the master copy of the hierarchical element in the integrated circuit design;
    a first shadow structure, the first shadow structure representing one or more first layer shadows for the first layer, the one or more first layer shadows identifying boundaries of instances of shapes in the first layer, the instances of shapes corresponding to one or more shapes in the first layer that are within instances associated with the master copy; and
    a second shadow structure, the second shadow structure representing one or more second layer shadows for the second layer, the one or more second layer shadows identifying boundaries of instances of shapes in the second layer, the instances of shapes corresponding to one or more shapes in the second layer that are within instances associated with the master copy.

24. The structure of claim 23, wherein the first shape structure further comprises:
    nested instances of shapes in the first layer.

25. The structure of claim 23, wherein the second shape structure further comprises:
    nested instances of shapes in the second layer.

26. The structure of claim 23, wherein the first shadow structure further comprises:
    one shadow for each instance.

27. A computer program product comprising a computer usable medium storing instructions which, when executed by a processing system, cause the system to perform a method of representing a design of an electronic system having multiple hierarchical levels of dispersed over multiple physical layers, the method comprising:
    for each layer, storing a plurality of shape master copies for the layer;
    generating a hierarchy of instances of shapes having n levels, where n is an integer greater than or equal to 1, each instance of a shape corresponding to one of the shape master copies; and
    for each layer, generating a hierarchy of shadow having the n levels, each shadow tracking a set of boundaries for one or more shapes from one or more levels of the n levels in the hierarchy of instances of shapes that exist on each layer of the design.

28. The computer program product of claim 27 wherein generating a first level for the hierarchy of instances of shapes comprises:
    generating a first instance of a shape corresponding to a first master copy.

29. The computer program product of claim 27 wherein generating a shadow for level n comprises:
    determining a shadow based on the union of bounds for elements of the master copy corresponding to the instance of a shape for level n-1;
    replacing each of the level n-1 instances of shapes in the $n^{th}$ master copy with the shadow to generate the level n shadow.

30. A system for representing a design of an electronic system having multiple hierarchical levels dispersed over multiple physical layers, comprising:
    means for storing a plurality of shape master copies for each physical layer;
    means for generating a hierarchy of instances of shapes having n levels, where n is an integer greater than or equal to 1, each instance of a shape corresponding to one of the shape master copies; and
    means for generating a hierarchy of shadow having the n levels, each shadow tracking a set of boundaries for one or more shapes from one or more levels of the n levels in the hierarchy of instances of shapes that exist on each layer of the design.

31. A system for representing an integrated circuit design, the integrated circuit design having a hierarchy of design elements dispersed over a plurality of physical layers, comprising:
    means for maintaining a first structure that represents one or more shapes a master copy of a hierarchical element that are located in one of the plurality of physical layers in the integrated circuit design; and
    means for maintaining a second structure that represents zero or more boundaries of instances of shapes, the instances of shapes corresponding to one or more shapes in one or more instances that are located in one of the plurality of physical layers, the one or more instances associated with the master copy of the hierarchical element.

32. The system of claim 31, wherein the means for maintaining the first structure further comprises:
    means for maintaining nested instances of shapes in the layer.

33. The system of claim 31, wherein the means for maintaining the second structure further comprises:
    means for maintaining a representation of shape boundaries for each instance.

34. A computer program product comprising a computer usable medium storing instructions which, when executed by a processing system, cause the system to perform a method of representing an integrated circuit design, the integrated circuit design having a hierarchy of design elements dispersed over a plurality of physical layers, the method comprising:
    maintaining a first structure that represents one or more design element shapes in an occurrence of a hierarchical element that are located in one of the plurality of physical layers in the integrated circuit design; and
    maintaining a second structure that represents one or more boundaries of instance shapes, the instance shapes corresponding to one or more shapes in one or more instances that are located in one of the plurality of physical layers, the one or more instances associated with the occurrence of the hierarchical element.

35. The computer program product of claim 34, wherein maintaining the first structure further comprises:
  maintaining nested instances of shapes in the layer.

36. The computer program product of claim 34, wherein maintaining the second structure further comprises:
  maintaining a representation of shape boundaries for each instance.

37. A system for analyzing a layer of a plurality of physical layers of an electronic design comprising:
  (a) means for determining a search area;
  (b) means for selecting a level from a plurality of levels in the hierarchy as the current level for one layer of the plurality of physical layers;
  (c) means for identifying shapes within the search area corresponding to the current level instance of a shape; and
  (d) means for determining whether shapes are within the search area by searching a current level shadow, each shadow tracking a set of boundaries for one or more shapes from one or more of the plurality of levels in the hierarchy of instances of shapes that exist on each physical layer of the design.

38. The system of claim 37, further comprising:
  (f) means for identifying one or more shapes from the current level shadow; and
  (g) means for replacing the current level with a lower level.

39. The system of claim 37, further comprising:
  (h) means for repeating (a) through (g) until no further shadow that intersect the search area are to be searched.

40. A computer program product comprising a computer usable medium storing instructions which, when executed by a processing system, cause the system to perform a method of analyzing one of a plurality of physical layers of an electronic design, the method comprising:
  (a) determining a search area;
  (b) selecting a level from a plurality of levels in the hierarchy as the current level for one layer of the plurality of physical layers in the electronic design;
  (c) identifying shapes within the search area corresponding to the current level instance of a shape; and
  (d) determining whether shapes are within the search area by searching a current level shadow, each shadow tracking a set of boundaries for one or more shapes from one or more of the plurality of levels in the hierarchy of instances of shapes that exist on each physical layer of the design.

41. The computer program product of claim 40, further comprising:
  (f) identifying one or more shapes from the current level shadow; and
  (g) replacing the current level with a lower level.

42. The computer program product of claim 41, further comprising:
  (h) repeating (a) through (g) until no further shadow that intersect the search area are to be searched.

43. A system for searching a representation of an integrated circuit design, the integrated circuit design having a hierarchy of design elements dispersed over a plurality of physical layers, comprising:
  (a) means for identifying a search area;
  (b) means for searching a first structure that represents one or more shapes an occurrence of a hierarchical element that are located in one of the plurality of physical layers in the integrated circuit design; and
  (c) means for searching a second structure that represents one or more boundaries of instance shapes, the instance shapes corresponding to one or more shapes in one or more instance that are located in one of the plurality of physical layers, the one or more instances associated with the occurrence of the hierarchical element.

44. The system of claim 43, wherein the means for searching the first structure further comprises:
  (d) means for searching one or more levels of nested instances of shapes in the second structure.

45. The system of claim 43, wherein the means for searching the second structure further comprises:
  means for searching a representation of shape boundaries for each instance.

46. A computer program product comprising a computer usable medium storing instructions which, when executed by a processing system, cause the system to perform a method of searching a representation of an integrated circuit design, the integrated circuit design having a hierarchy of design elements dispersed over a plurality of physical layers, the method comprising:
  (a) identifying a search area;
  (b) searching a first structure that represents one or more shapes an occurrence of a hierarchical element that are located in one of the plurality of physical layers in the integrated circuit design; and
  (c) searching a second structure that represents one or more boundaries of instance shapes, the instance shapes corresponding to one or more shapes in one or more instances that are located in one of the plurality of physical layers, the one or more instances associated with the occurrence of the hierarchical element.

47. The computer program product of claim 46, wherein searching the first structure further comprises:
  (d) searching one or more levels of nested instances of shapes in the second structure.

48. The computer program product of claim 46, wherein searching the second structure further comprises:
  searching a representation of shape boundaries for each instance.

* * * * *